(12) United States Patent
Oh et al.

(10) Patent No.: US 12,444,638 B2
(45) Date of Patent: Oct. 14, 2025

(54) CHIP WET TRANSFER METHOD AND EQUIPMENT USING MAGNETIC FORCE

(71) Applicant: SAMSUNG ELECTRONICS CO., LTD., Suwon-si (KR)

(72) Inventors: Youngtek Oh, Suwon-si (KR); Kyungwook Hwang, Suwon-si (KR); Dongho Kim, Suwon-si (KR); Joonyong Park, Suwon-si (KR); Sanghoon Song, Suwon-si (KR); Minchul Yu, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 18/442,908

(22) Filed: Feb. 15, 2024

(65) Prior Publication Data
US 2025/0006542 A1 Jan. 2, 2025

(30) Foreign Application Priority Data
Jun. 29, 2023 (KR) .......................... 10-2023-0084526

(51) Int. Cl.
*H01L 21/683* (2006.01)
*H01L 21/67* (2006.01)
(Continued)

(52) U.S. Cl.
CPC .... *H01L 21/6835* (2013.01); *H01L 21/67132* (2013.01); *H01L 21/68* (2013.01);
(Continued)

(58) Field of Classification Search
CPC ..... H01L 37/52; H01L 33/50; H01L 25/0753; H01L 21/67132; H01L 21/6835;
(Continued)

(56) References Cited

U.S. PATENT DOCUMENTS

| 11,227,853 B2 | 1/2022 | Israel et al. |
| 2017/0133558 A1 | 5/2017 | Sasaki et al. |
(Continued)

FOREIGN PATENT DOCUMENTS

| JP | 7-122841 A | 5/1995 | |
| JP | 09153541 A * | 6/1997 | ... H01L 2221/68313 |
(Continued)

OTHER PUBLICATIONS

Office Action issued Jan. 16, 2025 by the Korean Patent Office for KR Patent Application No. 10-2023-0084526.

*Primary Examiner* — James R Bidwell
(74) *Attorney, Agent, or Firm* — Sughrue Mion, PLLC

(57) ABSTRACT

A semiconductor chip wet transfer method includes: preparing a transfer substrate that includes a plurality of recesses; supplying a liquid that includes semiconductor chips onto the plurality of recesses of the transfer substrate; aligning the semiconductor chips in the plurality of recesses by sweeping, with an align bar, an upper surface of the transfer substrate supplied with the liquid; and performing cleaning by removing semiconductor chips that are not aligned in the plurality of recesses by using a first magnetic force generating device disposed facing a lower surface of the transfer substrate.

20 Claims, 26 Drawing Sheets

(51) Int. Cl.
*H01L 21/68* (2006.01)
*H01L 25/075* (2006.01)

(52) U.S. Cl.
CPC .................. *H01L 25/0753* (2013.01); *H01L 2221/68313* (2013.01); *H01L 2221/68381* (2013.01)

(58) Field of Classification Search
CPC ........... H01L 21/68; H01L 2221/68313; H01L 2221/68381
See application file for complete search history.

(56) References Cited

U.S. PATENT DOCUMENTS

| | | | |
|---|---|---|---|
| 2018/0102352 A1 | 4/2018 | Sasaki et al. | |
| 2019/0326144 A1 | 10/2019 | Shim et al. | |
| 2020/0051862 A1* | 2/2020 | Piao | H01L 21/304 |
| 2022/0013400 A1 | 1/2022 | Hwang et al. | |
| 2022/0189810 A1* | 6/2022 | Hwang | H01L 23/544 |
| 2022/0189931 A1* | 6/2022 | Hwang | H10H 20/851 |
| 2023/0043559 A1 | 2/2023 | Kim et al. | |
| 2024/0242998 A1* | 7/2024 | Cok | G03F 7/0002 |

FOREIGN PATENT DOCUMENTS

| | | |
|---|---|---|
| KR | 10-2020-0014867 A | 2/2020 |
| KR | 10-2022-0077522 A | 6/2022 |
| KR | 10-2022-0083538 A | 6/2022 |
| KR | 10-2022-0139703 A | 10/2022 |

\* cited by examiner $F_{van} \approx F_{mag} \gg F_g$

CHIP WET TRANSFER METHOD AND EQUIPMENT USING MAGNETIC FORCE

CROSS-REFERENCE TO RELATED APPLICATION

This application is based on and claims priority under 35 U.S.C. § 119 to Korean Patent Application No. 10-2023-0084526, filed on Jun. 29, 2023, in the Korean Intellectual Property Office, the disclosure of which is incorporated by reference herein in its entirety.

BACKGROUND

1. Field

The disclosed embodiments relate to a transfer method and device through wet transfer of a semiconductor chip.

2. Description of the Related Art

Industrial demand for light emitting diodes (LEDs) has increased due to their low power consumption and eco-friendliness, and LEDs have been applied not only to lighting devices or LCD backlights but also to display devices. In manufacturing a display device using an LED chip in micro units, a pick and place method is used as a method of transferring micro LEDs. However, productivity in this method is degraded as the size of the micro LED decreases and the size of a display increases.

SUMMARY

Provided is a chip wet transfer method using a magnetic force.

Provide is chip wet transfer equipment using a magnetic force.

Additional aspects will be set forth in part in the description which follows and, in part, will be apparent from the description, or may be learned by practice of the presented embodiments.

A semiconductor chip wet transfer method may include: preparing a transfer substrate that includes a plurality of recesses; supplying a liquid that includes semiconductor chips onto the plurality of recesses of the transfer substrate; aligning the semiconductor chips in the plurality of recesses by sweeping, with an align bar, an upper surface of the transfer substrate supplied with the liquid; and performing cleaning by removing semiconductor chips that are not aligned in the plurality of recesses by using a first magnetic force generating device disposed facing a lower surface of the transfer substrate.

The cleaning may include (i) simultaneously moving the first magnetic force generating device with the align bar to a corresponding position, and (ii) applying a magnetic force to an area corresponding to an area of the upper surface of the transfer substrate, which is swept with the align bar.

In the first magnetic force generating device, magnetism may be provided or a magnetic pole or a magnetic force may be adjusted according to an electric signal.

The first magnetic force generating device may have an area greater than or equal to an entire area of the transfer substrate.

In the first magnetic force generating device, magnetism may be provided or a magnetic pole or a magnetic force is adjusted according to an electric signal. The cleaning may include inputting the electric signal to an area corresponding to the align bar to apply the magnetic force.

The first magnetic force generating device may include a driver located at one side of the first magnetic force generating device. When the align bar sweeps an upper portion of the transfer substrate, the driver moves up and down to apply a magnetic force.

The semiconductor chip wet transfer method may further include removing, by a second magnetic force generating device, the semiconductor chips that are not aligned in the plurality of recesses from the transfer substrate by moving the semiconductor chips that are not aligned in the plurality of recesses in a first direction using a magnetic field.

The removing by the second magnetic force generating device may include providing, by the second magnetic force generating device, the magnetic field to move the semiconductor chips that are not aligned in the plurality of recesses in a second direction perpendicular to the first direction.

Semiconductor chip wet transfer equipment may include: a transfer head configured to support a transfer substrate on which semiconductor chips are aligned; an align bar configured to sweep the transfer substrate on the transfer head; and a first magnetic force generating device disposed on a lower surface of the transfer head. The first magnetic force generating device may be configured to apply a magnetic force toward a bottom of each of a plurality of recesses formed in the transfer substrate.

The transfer head may include a rail portion. The first magnetic force generating device may be configured to perform a translating motion along the rail portion.

The first magnetic force generating device may be configured to (i) simultaneously move with the align bar to a corresponding area, and (ii) apply a magnetic force to an area of the upper surface of the transfer substrate, which is swept with the align bar.

The first magnetic force generating device may be configured to provide magnetism or adjust a magnetic pole or a magnetic force according to an electric signal.

Based on a direction in which the align bar or the first magnetic force generating device moves, a width of the first magnetic force generating device may be smaller than a width of the transfer substrate.

The first magnetic force generating device may have an area greater than or equal to an entire area of the transfer substrate.

The first magnetic force generating device may be configured to provide magnetism or adjust a magnetic pole or the magnetic force according to an electric signal. The electric signal may be input to an area in which transfer is performed with the align bar to apply the magnetic force.

The first magnetic force generating device may include a driver that is disposed on a lower surface of the first magnetic force generating device and is configured to vertically move up and down.

A semiconductor chip of the semiconductor chips may be included in each of the plurality of recesses of the transfer substrate. The semiconductor chip may include an electrode. The electrode may include a magnetic layer. The magnetic layer may include a magnetic material. The magnetic material may include at least one metal of nickel (Ni), iron (Fe), cobalt (Co), gadolinium (Gd), or an alloy thereof.

The semiconductor chip wet transfer equipment may further include: a liquid feeder configured to supply a liquid to a recess of the plurality of recesses; and a semiconductor chip feeder configured to supply a semiconductor chip aligned in the recess.

The semiconductor chip wet transfer equipment may further include: a chamber configured to accommodate the transfer head therein; and a second magnetic force generating device configured to remove semiconductor chips that are not aligned in the plurality of recesses from the transfer substrate by moving the semiconductor chips that are not aligned in the plurality of recesses in a direction parallel to an upper surface of the transfer substrate by using a magnetic field.

The second magnetic force generating device may be configured to move the semiconductor chips that are not aligned in the plurality of recesses to a space between the transfer substrate and a side surface of the chamber.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
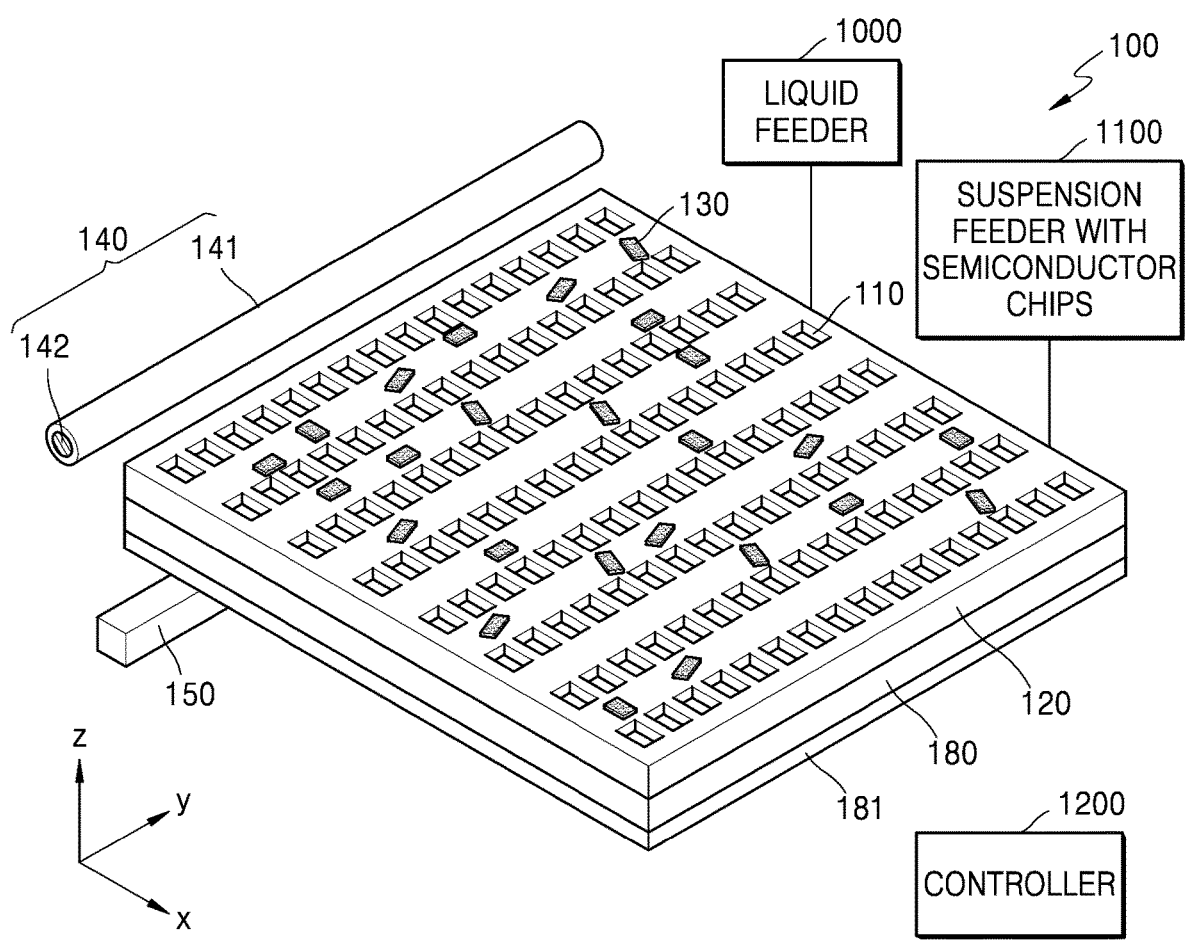
FIG. 1 is a diagram of transfer equipment used in a semiconductor chip wet transfer method, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a memory device including a vertical channel transistor will be described in detail with reference to the accompanying drawings. In the following drawings, the same reference numerals denote the same components, and the size of each component in the drawings may be exaggerated for clarity and convenience of description. In addition, embodiments described below are merely exemplary, and various modifications are possible from the embodiments.

Hereinafter, when an element is referred to as being "above" or "on" another element, the element may be directly on another element or intervening elements may be present. The singular expressions include the plural expressions unless clearly specified otherwise in context. In addition, when a certain part "includes" a certain component, this indicates that the part may further include another component instead of excluding another component unless there is no different disclosure.

The use of the term "the" and similar denoting terms may correspond to both singular and plural. The operations of all methods described herein may be performed in any suitable order unless otherwise indicated herein or otherwise clearly contradicted by context, and is not limited to the described order of the operations.

The terms, such as "unit" or "module", need to be understood as a unit that processes at least one function or operation and that is embodied in a hardware manner, a software manner, or a combination of the hardware manner and the software manner.

The connections or connection members of lines between components shown in the drawings exemplify functional connections and/or physical or circuit connections, and in actual devices, may be represented as various functional connections, physical connections, or circuit connections.

The use of all examples or exemplary terms is simply for explaining technical ideas in detail, and the scope is not limited by these examples or exemplary terms unless limited by the claims.

FIG. 1 is a diagram of transfer equipment used in a semiconductor chip wet transfer method, according to an embodiment.

Referring to FIG. 1, a semiconductor chip wet transfer equipment 100 aligns semiconductor chips 130 on a transfer substrate 120 including a plurality of recesses 110. To this end, the semiconductor chip wet transfer equipment 100 may include a transfer head 180 supporting the transfer substrate 120 on which the semiconductor chips 130 are to be aligned, a suspension feeder 1100 with semiconductor chips supplying the semiconductor chips 130 on the transfer substrate 120, a liquid feeder 1000 supplying a liquid for wet transfer on the transfer substrate 120, an align bar 140 absorbing the liquid in the recesses 110 of the transfer substrate 120 while sweeping the transfer substrate 120, and a first magnetic force generating device 150 applying a magnetic force to the semiconductor chips 130.

The semiconductor chips 130 may be supplied by the suspension feeder 1100 with semiconductor chips, and the liquid feeder 1000 may simultaneously or sequentially supply the liquid as necessary. The liquid feeder 1000 may include a liquid sprayer, a liquid spreader, a liquid dispenser, an inkjet dotter, or a liquid diffuser. A shape or structure of the liquid feeder 1000 is not limited as long as the liquid is properly supplied to the transfer substrate 120.

The suspension feeder 1100 with semiconductor chips may supply a suspension containing semiconductor chips in various ways, such as spraying or dispersing the suspension on the transfer substrate 120. When the suspension is supplied to the transfer substrate 120, the liquid feeder 1000 and the suspension feeder 1100 with semiconductor chips may be configured as one. Even when the suspension feeder 1100 with semiconductor chips supplies a suspension to the transfer substrate 120, it may be possible to previously supply a separate liquid to the transfer substrate 120.

The align bar 140 may include a support 142 formed through a central portion and a hydrophilic wiper 141 formed to cover the exterior of the support 142. The align bar 140 may absorb the liquid in the recesses 110 while sweeping the transfer substrate 120. The align bar 140 may include any material that absorbs a liquid, such as fabric including cotton and wool, tissue, polyester fiber, paper, and/or a wiper.

The transfer head 180 supporting the transfer substrate 120 may be disposed on a lower surface of the transfer substrate 120, and the transfer head 180 may include a rail portion 181 formed on a lower surface thereof.

The first magnetic force generating device 150 may perform a translating motion along the rail portion 181, and may simultaneously perform a translating motion with the align bar 140 to correspond to an area swept by the align bar 140. Therefore, the first magnetic force generating device 150 may move relative to the transfer substrate 120 on the transfer head 180 through the rail portion 181. The rail portion 181 is only an example for moving the first magnetic force generating device 150, and various other devices for relatively moving the first magnetic force generating device 150 with respect to the transfer substrate 120 may be used instead of the rail portion 181.

The semiconductor chip wet transfer equipment 100 may include a controller 1200, and the controller 1200 may generate signals for controlling whether the liquid feeder 1000 supplies the liquid, whether the suspension feeder 1100 with semiconductor chips supplies the suspension with semiconductor chips, whether the align bar 140 is operated, and whether the first magnetic force generating device 150 is operated.

Figure 2:
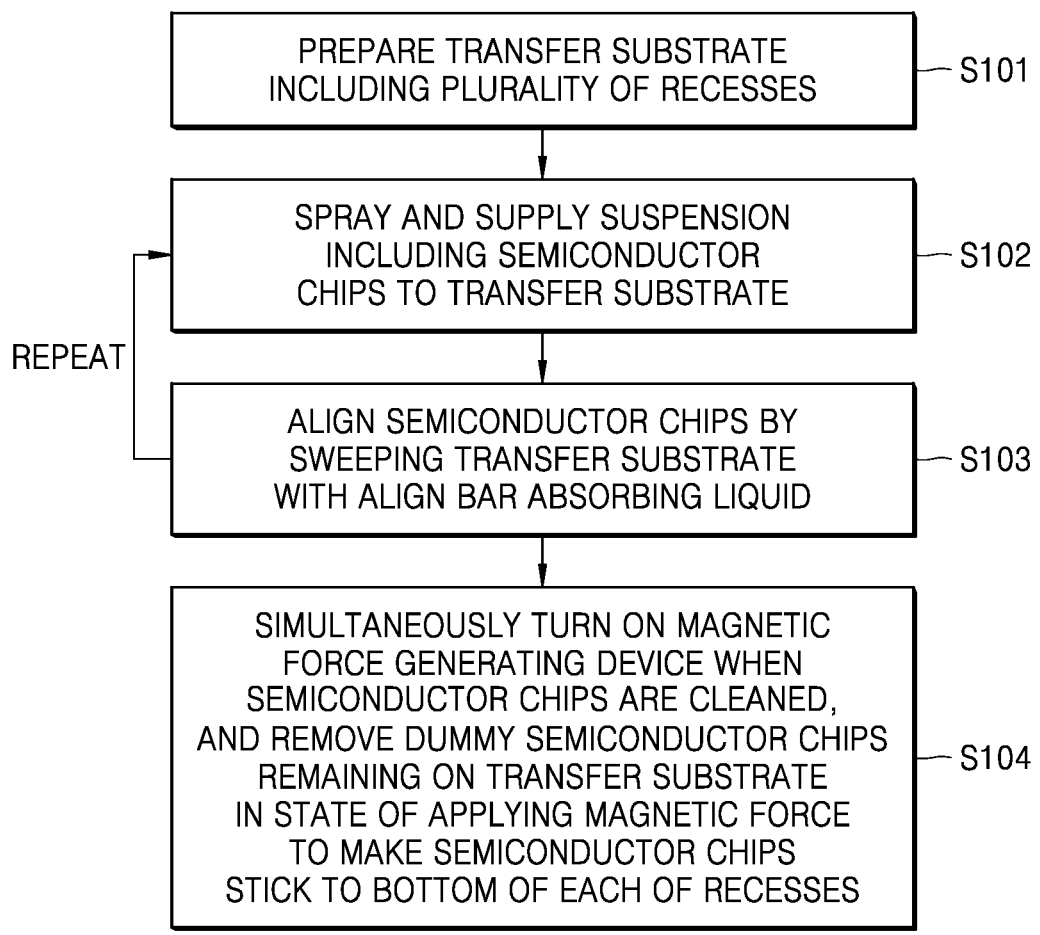
FIG. 2 is a flowchart of a semiconductor chip wet transfer method according to an embodiment.

FIG. 2 is a flowchart of a semiconductor chip wet transfer method according to an embodiment.

Referring to FIGS. 1 and 2, the transfer substrate 120 including the plurality of recesses 110 is prepared (S101). The transfer substrate 120 may be provided as a single layer or may include a plurality of layers. The recesses 110 may be provided to position the semiconductor chips 130 thereon. The semiconductor chips 130 may include various types of semiconductor chips having a micro size, and the micro size may be 1000 § ¬ or less or 200 § ¬ or less. The semiconductor chips 130 may include, for example, a light emitting diode (LED), a complementary metal-oxide semiconductor (CMOS), a CMOS image sensor (CIS), a vertical-cavity surface-emitting laser (VCSEL), a photo diode (PD), a memory device, or a 2-dimensional (2D) material device. A 2D material may be graphene, and/or a carbon nano tube (CNT).

A suspension 170 including a chip is sprayed and supplied to the transfer substrate 120 (S102). Any type of liquid may be used as long as the liquid does not corrode or damage the semiconductor chips 130. The liquid may include, for example, one or a plurality of combinations of the group consisting of water, ethanol, alcohol, polyol, ketone, halocarbon, acetone, flux, and organic solvent. The organic solvent may include, for example, isopropyl alcohol (IPA). The usable liquid is not limited thereto and various changes are possible.

As a method of spraying and supplying the suspension 170 including a chip to the transfer substrate 120, various methods, for example, a spray method, a dispensing method, an inkjet dot method, or a method of flowing a liquid onto the transfer substrate 120 may be used. This will be described below. A supply amount of the liquid may be variously adjusted to fit into the recesses 110 or overflow from the recesses 110.

The semiconductor chips 130 may be directly sprayed on the transfer substrate 120 without any other liquid or may be supplied while being contained in a suspension. As a method of supplying the semiconductor chips 130 included in the suspension, various methods, for example, a spray method, a dispensing method of dropping a liquid drop by drop, an inkjet dot method of discharging a liquid like a printing method, or a method of flowing a suspension onto the transfer substrate 120 may be used.

The transfer substrate 120 is swept with the align bar 140 absorbing the liquid to align the semiconductor chips 130 (S103).

The first magnetic force generating device 150 may perform a translating motion along the rail portion 181 while sweeping the transfer substrate 120 with the align bar 140 absorbing the liquid. The align bar 140 includes the support 142 and the hydrophilic wiper 141 that centers and surrounds the support. The hydrophilic wiper 141 is made of any material absorbing the liquid and a shape or structure of the hydrophilic wiper 141 is not limited. The hydrophilic wiper 141 may include, for example, fabric, tissue, polyester fiber, paper, or a wiper. The hydrophilic wiper 141 may be used alone without any other auxiliary equipment, but is not limited thereto, and may be coupled to the support 142 to conveniently sweep the transfer substrate 120. The support 142 may have various shapes and structures suitable for sweeping the transfer substrate 120. For example, the support 142 may have a shape such as a rod, a blade, a plate, or a wiper. The hydrophilic wiper 141 may be provided on one side of the support 142 or may surround a circumference of the support 142.

The align bar 140 may sweep the transfer substrate 120 while pressing the transfer substrate 120 with an appropriate pressure. The sweeping may include absorbing the liquid while the align bar 140 comes in contact with the transfer substrate 120 and passes the plurality of recesses 110. The sweeping may be performed using various methods, for example, a sliding method, a rotating method, a translating motion method, a reciprocating motion method, a rolling method, a spinning method, and/or a rubbing method, and may include both a regular method and an irregular method. The sweeping may be performed by moving the transfer substrate 120 instead of moving the align bar 140, and the sweeping on the transfer substrate 120 may also be performed by sliding, rotating, translating, reciprocating, rolling, spinning, and/or rubbing. It may also be possible to perform sweeping by cooperation of the align bar 140 and the transfer substrate 120.

When the semiconductor chips 130 are cleaned through the align bar 140, the magnetic force generating device starts operating at the same time, and applies a magnetic force to make the semiconductor chips 130 stick to a bottom of each of the recesses 110, and thus dummy semiconductor chips 130 that are not located in the recesses 110 and remain on the transfer substrate 120 are removed (S104).

The magnetic force generating device is not operated during a transfer process, and starts operating during the cleaning process after the transfer process is finished. Through this, while sweeping with the align bar 140 is performed, the dummy semiconductor chips 130 that are not located in the recesses 110 are removed during cleaning, and the semiconductor chips 130 located in the recesses 110 are not removed by a magnetic force during cleaning.

The spraying and supplying of the suspension 170 including the semiconductor chips 130 to the transfer substrate 120 (S102) and the sweeping on the transfer substrate 120 with the align bar 140 absorbing the liquid to align the semiconductor chips (S103) may be performed simultaneously in one operation. For example, the liquid and the semiconductor chips 130 may be simultaneously supplied to the transfer substrate 120 by supplying a suspension including the semiconductor chips 130 to the transfer substrate 120.

Through these operations, the semiconductor chips 130 may be quickly transferred to the transfer substrate 120.

Hereinafter, the transfer process of the semiconductor chips 130 will be described in more detail.

Figure 4A:
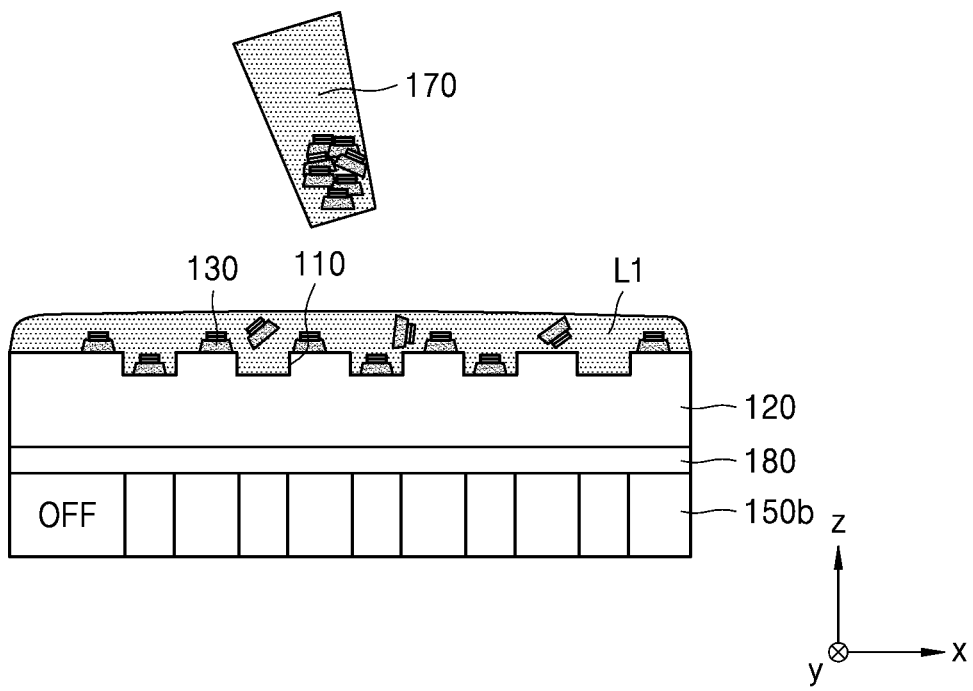
FIGS. 4A to 4D show a scanning process using transfer equipment used in a semiconductor chip wet transfer method, according to another embodiment.
Figure 4B:
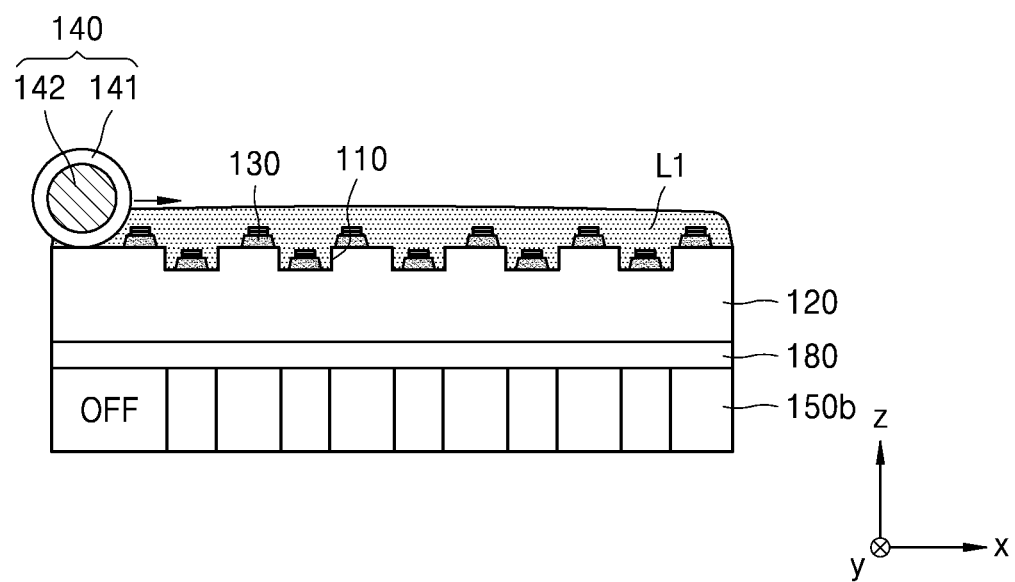
Figure 4C:
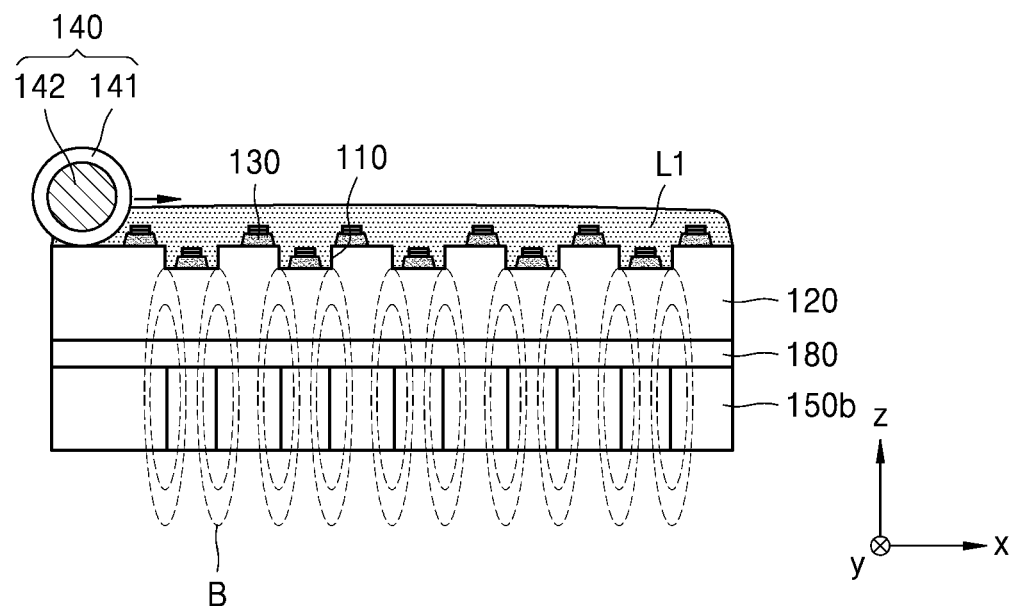
Figure 4D:
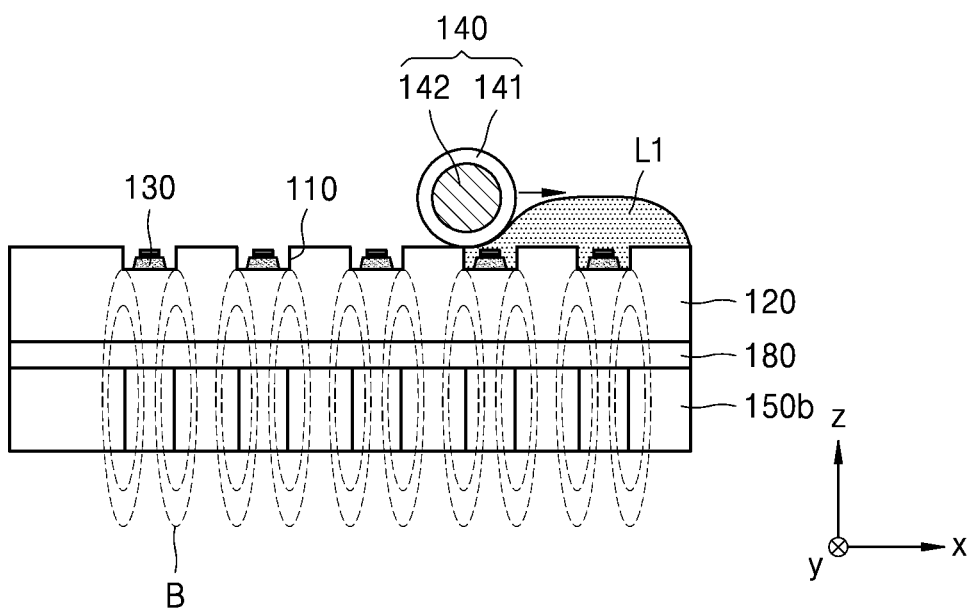
Figure 5:
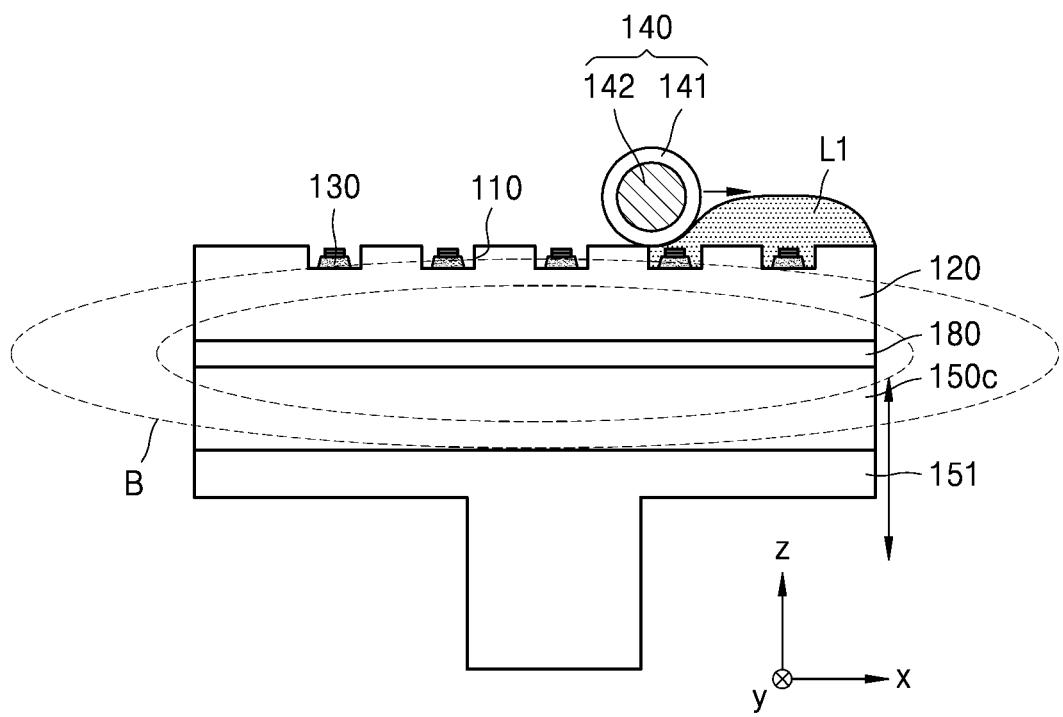
FIG. 5 shows a scanning process using transfer equipment used in a semiconductor chip wet transfer method, according to another embodiment.

FIGS. 3 to 5 show a scanning process of a semiconductor chip wet transfer method using various first magnetic force generating devices.

FIGS. 3A to 3D show a scanning process using transfer equipment used in a semiconductor chip wet transfer method, according to an embodiment.

Referring to FIGS. 3A to 3D, the semiconductor chip wet transfer equipment 100 may include the transfer head 180 on which the transfer substrate 120 is to be positioned, the rail portion 181, the align bar 140 inserting the semiconductor chips 130 on the transfer substrate 120 into the recesses 110 by sweeping an upper portion of the transfer substrate 120, and a first magnetic force generating device 150a applying a magnetic force to the semiconductor chips 130 to accommodate the semiconductor chips 130 in the recesses 110. The hydrophilic wiper 141 may come into contact with a surface of the transfer substrate 120 and sweep the surface of the transfer substrate 120 while being provided on a surface of the support 142.

Figure 3A:
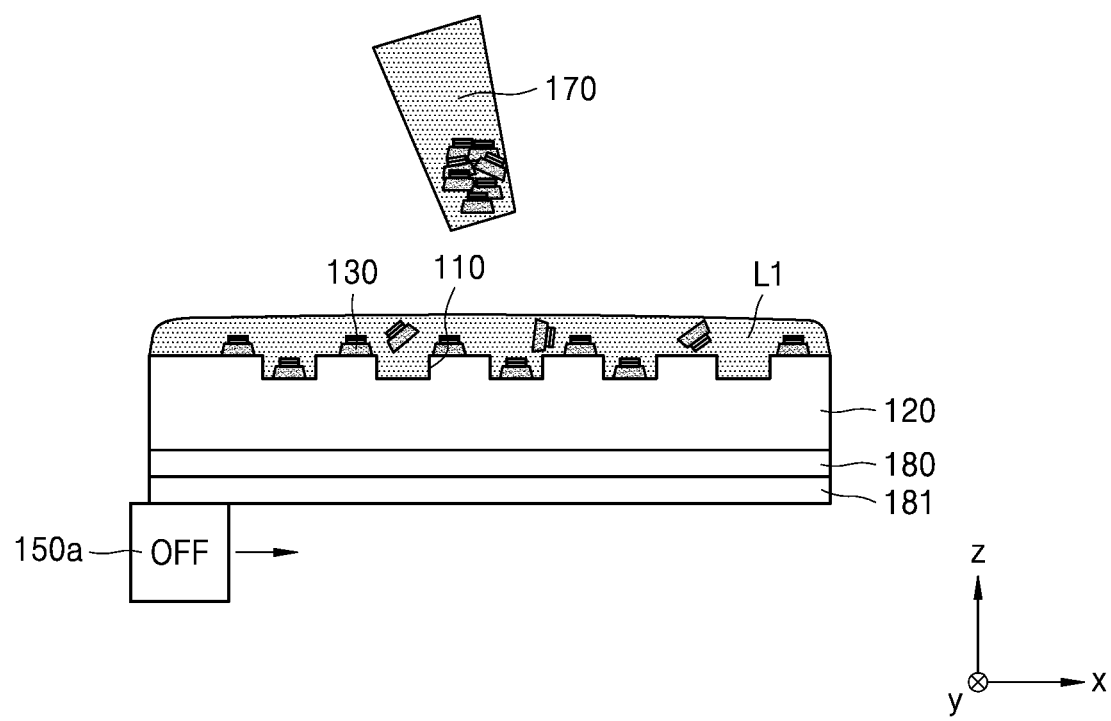
FIGS. 3A to 3D show a scanning process using transfer equipment used in a semiconductor chip wet transfer method, according to an embodiment.

Referring to FIG. 3A, the suspension 170 is supplied on the transfer substrate 120. The supplied suspension 170 is supplied to the recesses 110 located in the transfer substrate 120. In a process of supplying the suspension 170, the first magnetic force generating device 150a is in a non-operating state.

Figure 3B:
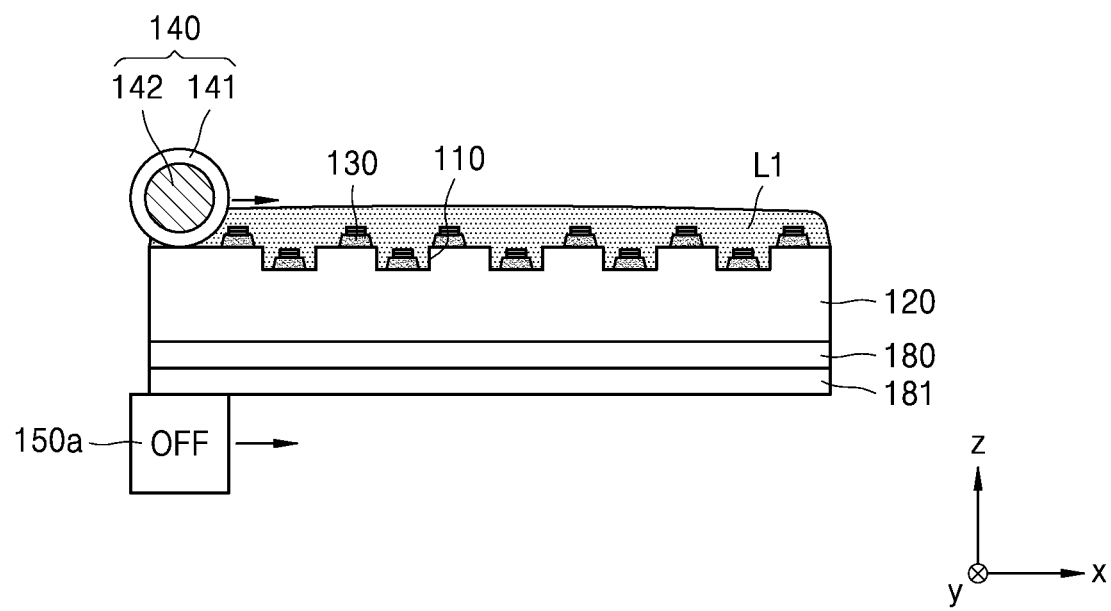

Referring to FIG. 3B, after supply of the suspension 170 is completed, the align bar 140 sweeps the upper portion of the transfer substrate 120. While the sweeping is performed, the semiconductor chips 130 may be moved while being adsorbed or attached to a surface of the align bar 140. While the align bar 140 comes in contact with the upper surface of the transfer substrate 120 and sweeps the upper surface of the transfer substrate 120, the first magnetic force generating device 150a located at one side of the transfer substrate 120 is in a non-operating state.

Figure 3C:
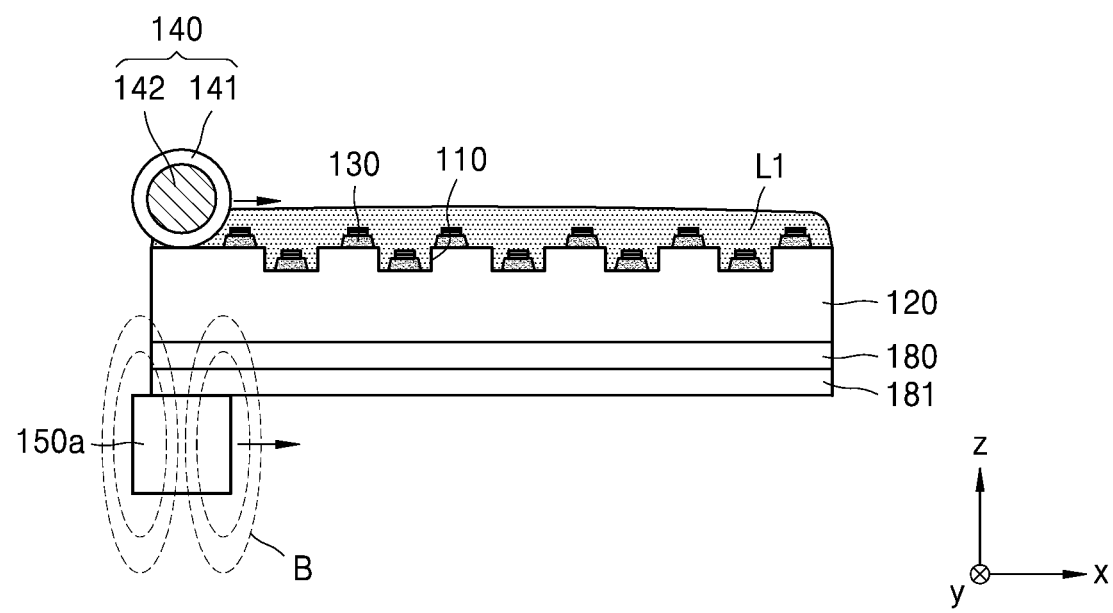

Referring to FIG. 3C, after the transfer of the align bar 140 is completed, a cleaning process for removing the semiconductor chips 130 that are not located in the recesses 110 of the transfer substrate 120 is started. The first magnetic force generating device 150a located at one side of the transfer substrate 120 may apply a magnetic force to the semiconductor chips 130 toward the bottom of each of the recesses 110 such that the semiconductor chips 130 already located in the recess 110 are not removed. To this end, the first magnetic force generating device 150a may be located to face the lower surface of the transfer substrate 120.

Figure 3D:
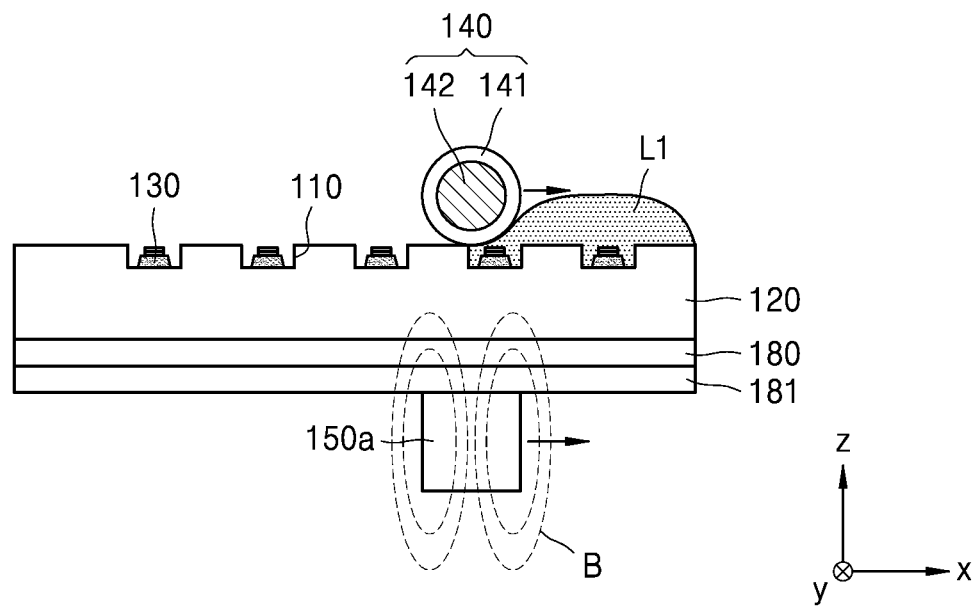

Referring to FIG. 3D, while the align bar 140 performs sweeping, the first magnetic force generating device 150a may be moved with the align bar to a corresponding position 140 and may apply a magnetic force only to an area corresponding to an area to be swept. The first magnetic force generating device 150a may perform a translating motion along the rail portion 181 disposed at a lower end of the transfer substrate 120. The first magnetic force generating device 150a may extend in the same direction as the align bar 140 and may have a length corresponding to that of the transfer substrate 120 in the y-axis direction. In other words, based on a direction that is perpendicular to a direction in which the align bar 140 or the first magnetic force generating device 150a moves and parallel to a surface of the transfer substrate 120, the length of the first magnetic force generating device 150a may be at least equal to the length of the transfer substrate 120. Alternatively, the length of the first magnetic force generating device 150a in the y-axis direction may be slightly greater than the length of the transfer substrate 120 in the y-axis direction. Based on a direction in which the align bar 140 or the first magnetic force generating device 150a moves, the width of the first magnetic force generating device 150a may be smaller than the width of the transfer substrate 120. For example, the width of the first magnetic force generating device 150a may be selected such that a range to which a magnetic force is applied in a direction in which the align bar 140 or the first magnetic force generating device 150a moves is the same as the width of the align bar 140.

The first magnetic force generating device 150a may be formed as an electromagnet, and in the first magnetic force generating device 150a, magnetism may be provided or a magnetic pole or a magnetic force is adjusted according to an electric signal. During sweeping, the electromagnet is operated to apply a magnetic force to the semiconductor chips 130, and when sweeping is finished, the electrical signal is not input, and thus a magnetic force may not be applied.

FIGS. 4A to 4D show a scanning process using transfer equipment used in a semiconductor chip wet transfer method, according to another embodiment.

Referring to FIG. 4A, a first magnetic force generating device 150b may be located at a lower end of the transfer substrate 120 and may be formed to have an area at least equal to or larger than an entire area of the transfer substrate 120.

The suspension 170 is supplied on the transfer substrate 120. The supplied suspension 170 is supplied to the recesses 110 located on the transfer substrate 120. In a process of supplying the suspension 170, the first magnetic force generating device 150b is in a non-operating state.

Referring to FIG. 4B, after supply of the suspension 170 is completed, the align bar 140 sweeps the upper portion of the transfer substrate 120. While sweeping is performed, the semiconductor chips 130 may move while being adsorbed or attached to a surface of the align bar 140. While the align bar 140 comes in contact with the upper surface of the transfer substrate 120 and sweeps the upper surface of the transfer substrate 120, the first magnetic force generating device 150b disposed at one side of the transfer substrate 120 is in a non-operating state.

Referring to FIGS. 4C and 4D, the first magnetic force generating device 150b may not operate while the align bar 140 sweeps the transfer substrate 120, but applies a magnetic force only to a portion to which the semiconductor chips 130 are transferred during cleaning. The first magnetic force generating device 150b may be formed as an electromagnet by inputting an electric signal only to the transferred portion, and magnetism may be provided or a magnetic pole or a magnetic force may be adjusted by the electric signal. The electromagnet is operated only during cleaning to apply a magnetic force to the semiconductor chips 130, and when cleaning is finished, no electric signal is input, and thus no magnetic force may be applied. In other words, the first magnetic force generating device 150b may be configured to selectively generate a magnetic field only for a portion of an entire area, which corresponds to the align bar 140, and whether or not a selective electric signal is input may be controlled by controller 1200 shown in FIG. 1.

Referring to FIG. 5, a first magnetic force generating device 150c may be located at a lower end of the transfer substrate 120 and may apply a magnetic for to an entire area of the transfer substrate 120. The first magnetic force generating device 150c includes a driver 151 located at one side, and the driver 151 may move up and down, and may determine the first magnetic force generating device 150c to apply a magnetic force to the semiconductor chips 130 through the up and down movement. While the align bar 140 sweeps the upper portion of the transfer substrate 120, the driver 151 may move downward and may not apply a magnetic force to the semiconductor chips 130, and during cleaning, the align bar 140 may move upward to apply a magnetic force to the semiconductor chips 130. The up and down movement of the driver 151 may be controlled by the controller 1200 shown in FIG. 1.

The first magnetic force generating device 150c may be formed of a ferromagnetic substance or an electromagnet, and in the case of the ferromagnetic substance, a magnetic force may always be applied to the semiconductor chips 130 without an electric signal. In the case of the electromagnet, magnetism may be provided by an electric signal, or a magnetic pole or a magnetic force may be adjusted. The electromagnet may operate only during cleaning to apply a magnetic force to the semiconductor chips 130, and after cleaning, no electric signal is input, and thus no magnetic force is applied.

The first magnetic force generating devices 150a, 150b, and 150c may be selectively applied according to the size of the semiconductor chips 130, a time required for the sweeping, and the size of the transfer substrate 120 to optimize the process or minimize power consumption.

Figure 6:
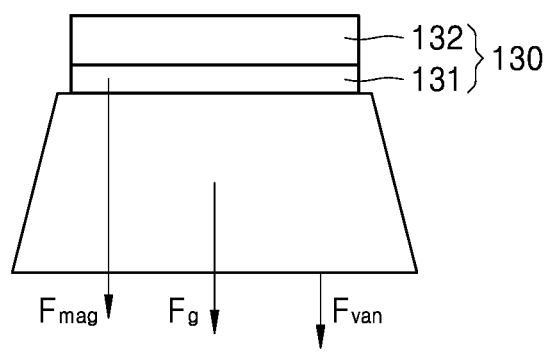
FIG. 6 shows a semiconductor chip including a magnetic layer, according to an embodiment.

FIG. 6 shows the semiconductor chip 130 including a magnetic layer 131, according to an embodiment.

Referring to FIG. 6, the semiconductor chip 130 may include the magnetic layer 131 and an electrode 132, and the magnetic layer 131 may be formed at one side of the electrode 132. Alternatively, the magnetic layer 131 may be a portion of the electrode 132, and the electrode 132 may have a multilayer structure including the magnetic layer 131.

The magnetic layer 131 may include a magnetic material. The magnetic material may include, for example, at least one metal of nickel (Ni), iron (Fe), cobalt (Co), and gadolinium (Gd), or an alloy thereof. However, the magnetic material is not necessarily limited thereto, and any material may be used as the magnetic layer 131 as long as the material has electrical conductivity and magnetism.

The semiconductor chips 130 may have a size with a side length of 100 μm or less and a thickness of 4 μm, but may be slightly larger or smaller depending on the purpose.

When the semiconductor chips 130 are not located in the recesses 110 of the transfer substrate 120 and are outside the recesses 110, even if a magnetic force is applied by the first magnetic force generating device 150, the upper surface of the transfer substrate 120 is very smooth, and thus the semiconductor chips 130 may move left and right easily due to a weak friction force. Through this movement, the semiconductor chips 130 that are not located in the recesses 110 may be cleaned.

A magnetic force may be applied in a vertical direction to the semiconductor chips 130 located in the recesses 110 by the first magnetic force generating device 150, and a sweeping direction of the align bar 140 is a horizontal direction, and thus two forces may act orthogonally to each other. In other words, the semiconductor chips 130 located inside the recesses 110 may not escape due to the magnetic force and a vertical wall of the recess 110.

The strength of a magnetic field may be determined by the characteristics of a magnetic material included in the first magnetic force generating device 150, a distance between the first magnetic force generating device 150 and the transfer substrate 120, an electric signal applied to the first magnetic force generating device 150. For example, when the first magnetic force generating device 150 includes an electromagnet, the strength of the magnetic field may be adjusted by the strength of the electric signal applied to the first magnetic force generating device 150.

Figure 7:
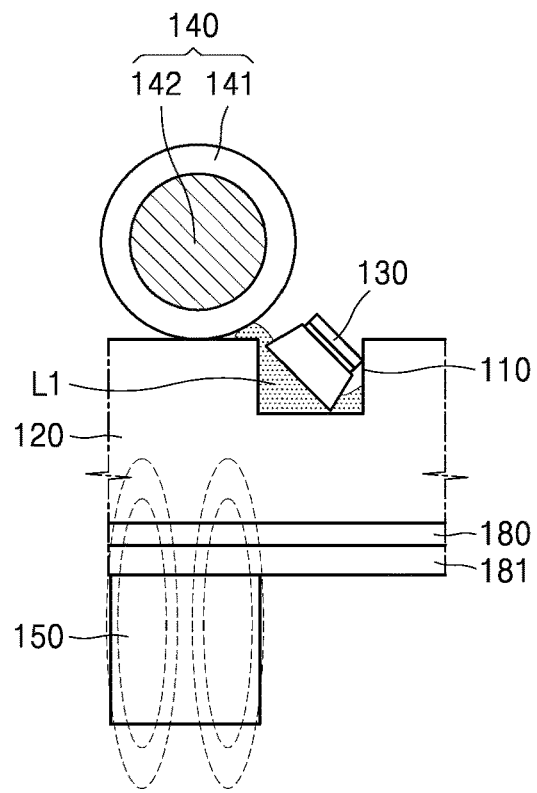
FIG. 7 shows a process of aligning semiconductor chips in a semiconductor chip wet alignment method, according to an embodiment.
Figure 8:
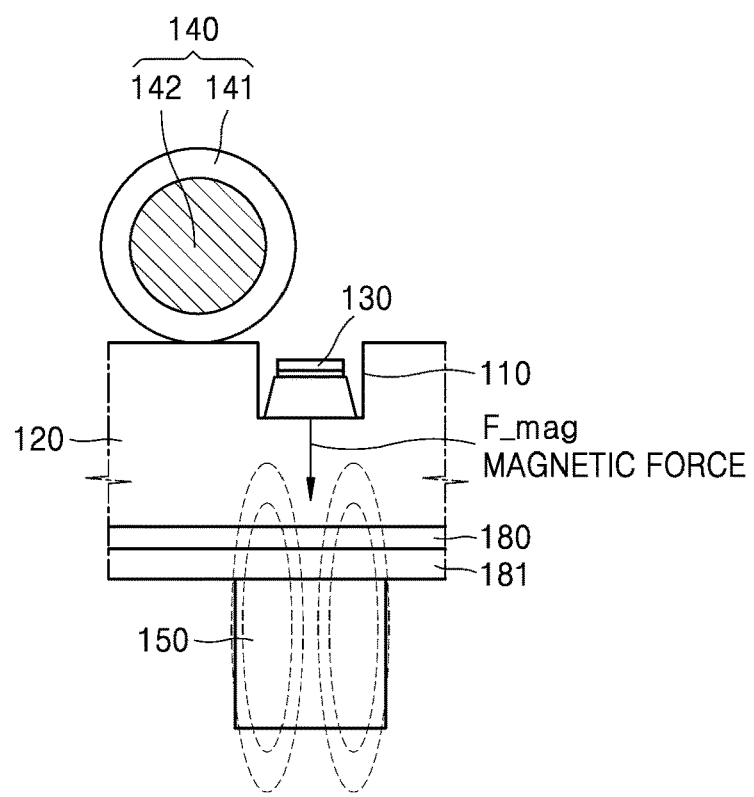
FIG. 8 shows a state in which a magnetic force is applied to aligned semiconductor chips, according to an embodiment.

FIG. 7 shows a process of aligning semiconductor chips in a semiconductor chip wet alignment method, according to an embodiment. FIG. 8 shows a state in which a magnetic force is applied to aligned semiconductor chips, according to an embodiment.

Referring to FIGS. 7 and 8, the recess 110 is enlarged, and the semiconductor chip 130 is positioned between the align bar 140 and the transfer substrate 120 while sweeping is performed, and the semiconductor chip 130 may enter the recess 110 in a process of absorbing a liquid L1 in the recess 110 by the hydrophilic wiper 141 as a component of the align bar 140.

When the liquid L1 is entirely absorbed, the semiconductor chip 130 may be located in the recess 110, the first magnetic force generating device 150 may apply a magnetic force to the semiconductor chip 130 positioned in the recess 110, and the semiconductor chip 130 may be fixed inside the recess 110 by receiving a magnetic force in the same direction as the direction of gravity.

Referring to FIG. 2, operations S102 and/or operation S103 may be repeatedly performed as necessary until all of the semiconductor chips 130 are transferred to the recesses 110 of the transfer substrate 120. For example, after the transfer substrate 120 is swept by the align bar 140, when a liquid is not present or is insufficient in the recesses 110, the spraying and supplying of the suspension 170 including the semiconductor chips 130 to the transfer substrate 120 (S102) may be further performed. When there is no shortage of the semiconductor chips 130 in the transfer substrate 120, it may be possible to proceed from operation S101 to operation S103 without going through operation S102. When a liquid is excessively supplied to the transfer substrate 120, some liquid may be removed using a blade (not shown) as necessary. After the transfer substrate 120 is swept by the align bar 140, when there is a shortage of the semiconductor chips 130 in the transfer substrate 120, the supplying of the suspension 170 to the transfer substrate 120 (S102) may be further performed. Through this process, the semiconductor chips 130 may be aligned on the transfer substrate 120.

Figure 9:
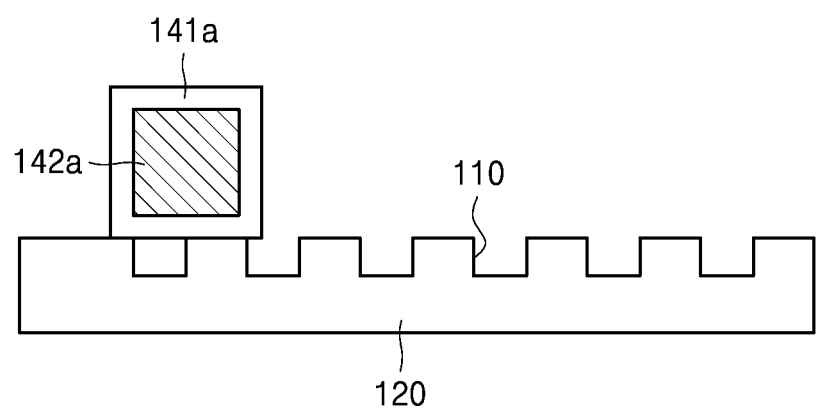
FIG. 9 is a diagram of an align bar according to another embodiment.

FIG. 9 is a diagram of an align bar according to another embodiment.

FIG. 9 shows an example in which a support 142a has a rectangular cross section. Like the support 142 in the form of a rod having a circular cross section in FIG. 1, a hydrophilic wiper 141a may be provided on one surface or an entire surface of the support 142a. The support may be implemented in various other forms as well.

Hereinafter, examples of a transfer substrate will be described.

FIGS. 10 to 13 show various examples of a transfer substrate of a display transfer structure according to an embodiment.

Figure 10:
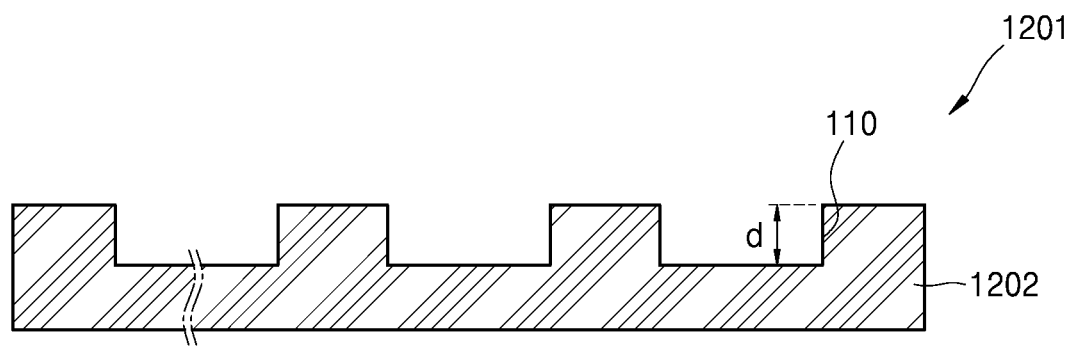
FIG. 10 is a diagram showing a transfer substrate according to an embodiment.

Referring to FIG. 10, a transfer substrate 1201 may include a substrate 1202 having a single body or single mold structure including the plurality of recesses 110. The substrate 1202 may include, for example, an organic material such as silicon, glass, sapphire, and a polymer, an inorganic material, and/or metal, and may be manufactured by photoresist patterning, etching, molding, but is limited thereto. The recesses 110 may guide transfer of semiconductor chips when the semiconductor chips are transferred to the transfer substrate 1201.

The recess 110 may have a cross-sectional area larger than that of the semiconductor chip to accommodate the semiconductor chip. The recess 110 may have an area into which only one semiconductor chip may enter, or may have an area into which a plurality of semiconductor chips may enter. The recess 110 may have a shape similar to a cross section of the semiconductor chip, for example, a circular cross section or a polygonal cross section. The recess 110 may have a depth less than or greater than the thickness of the semiconductor chip, for example, less than twice the thickness of the semiconductor chip, or a depth ranging from about 0.5 times to about 1.5 times the thickness of the semiconductor chip. A bottom surface of the recess 110 may have a roughness of 50 nm or less.

Figure 11:
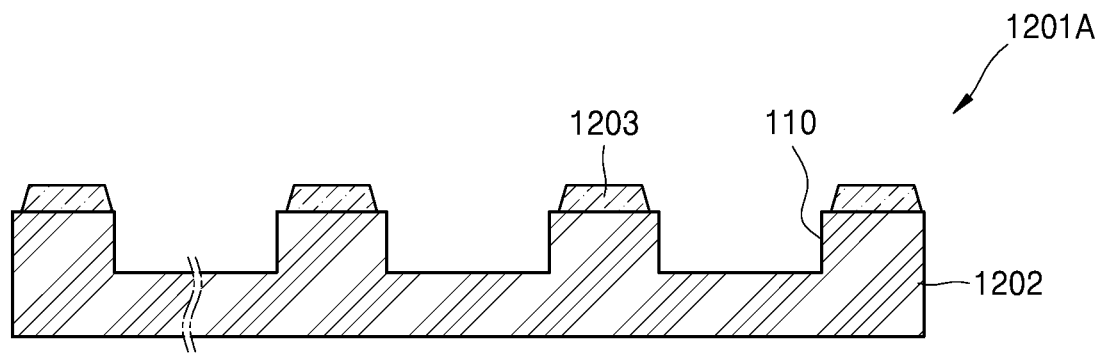
FIG. 11 is a diagram showing a transfer substrate according to another embodiment.

Referring to FIG. 11, a transfer substrate 1201A may further include a metal layer 1203 on a surface of the substrate 1202. The metal layer 1203 may include silver (Ag), gold (Au), platinum (Pt), nickel (Ni), chromium (Cr), and/or aluminium (Al) and may have a different surface energy than the substrate 1202. It is also possible to further couple a polymer to the metal layer 1203. This difference in surface energy not only allows the semiconductor chips to be transferred well to the recesses 110, but also allows the semiconductor chips remaining without being transferred to the recesses 110 to be separated well from the transfer substrate 1201A in the cleaning operation. To have a large surface energy difference, the metal layer 1203 may be selected from a hydrophobic material and the recess 110 may be selected from a hydrophilic material.

Figure 12:
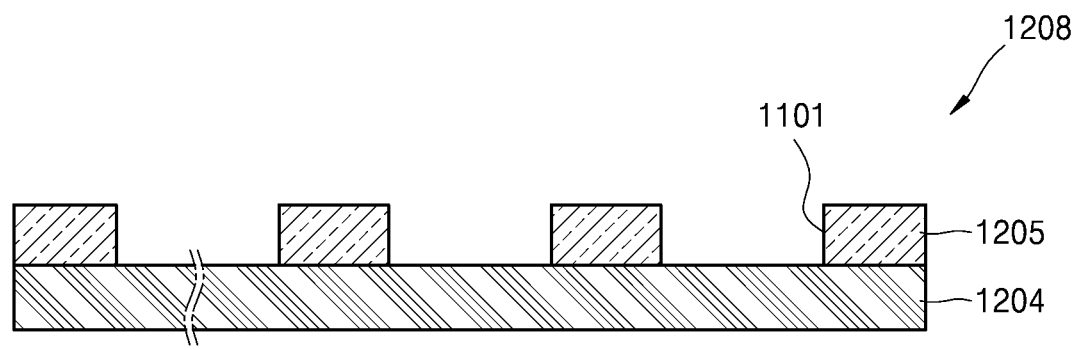
FIG. 12 is a diagram showing a transfer substrate including a transfer mold, according to another embodiment.
Figure 13:
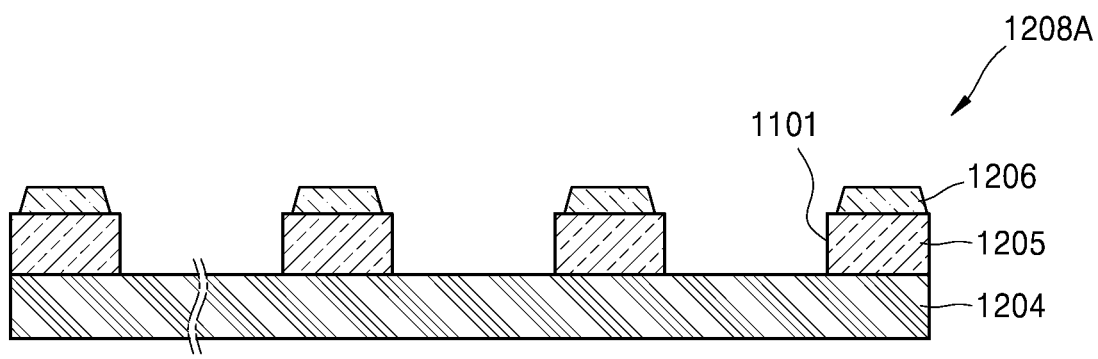
FIG. 13 is a diagram showing a transfer substrate according to another embodiment.

Referring to FIG. 12, a transfer substrate 1208 may include a substrate 1204 and a transfer mold 1205 provided on a surface of the substrate 1204. The transfer mold 1205 may include a plurality of recesses 1101 provided in the form of through holes or recesses. The substrate 1204 may be made of silicon, glass, and/or sapphire and the transfer mold 1205 may be made of $SiO_2$, Si, SiN, and/or a photoresist. Referring to FIG. 13, a transfer substrate 1208A may further include a metal layer 1206 on a surface of the transfer mold 1205 like in the description of the embodiment of FIG. 11.

Figure 14:
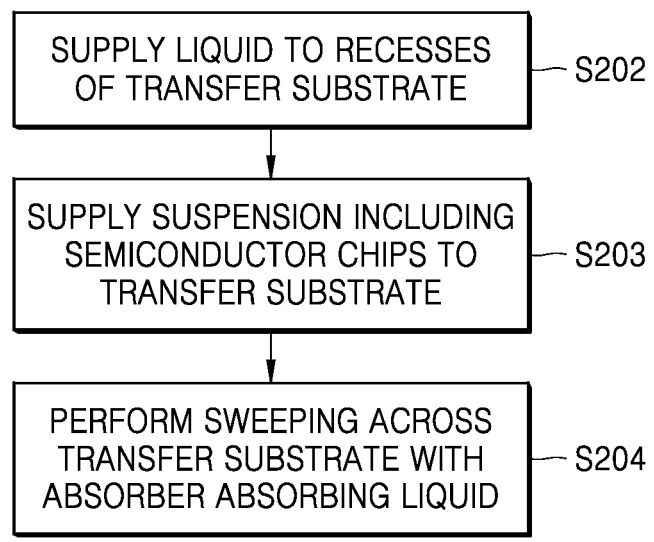
FIG. 14 is a flowchart of a semiconductor chip wet transfer method according to an embodiment.
Figure 15:
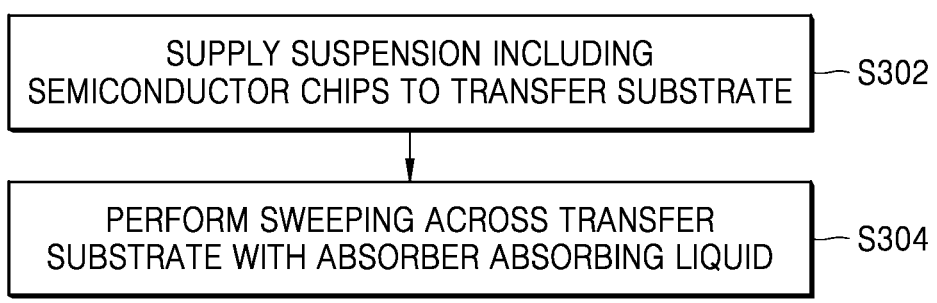
FIG. 15 is a flowchart of a semiconductor chip wet transfer method according to an embodiment
Figure 16:
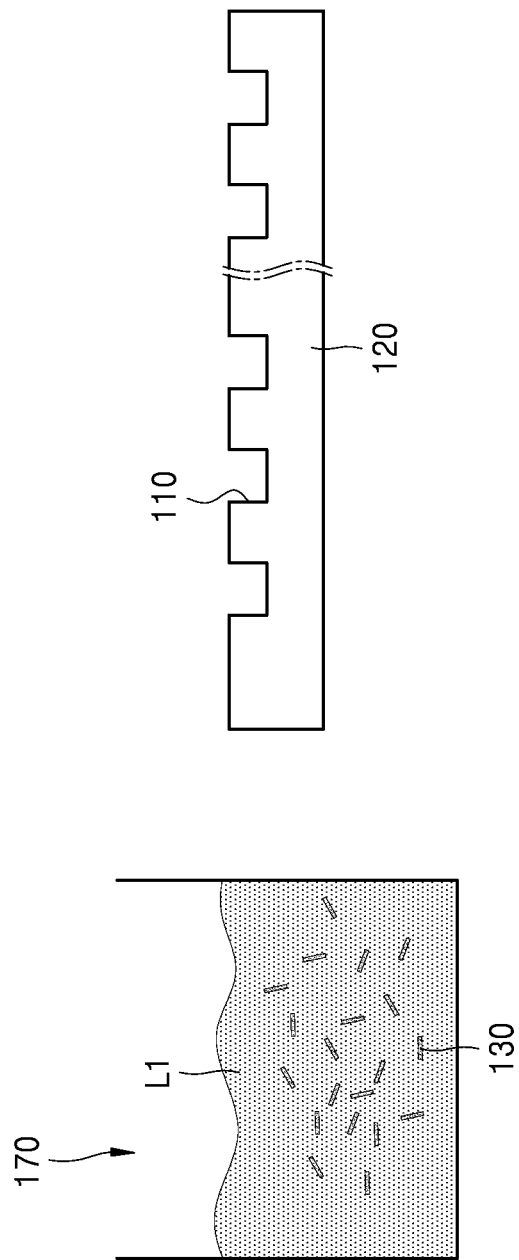
FIG. 16 is a diagram showing a suspension and a substrate, according to an embodiment.

FIG. 14 is a flowchart of a semiconductor chip wet transfer method according to an embodiment. FIG. 15 is a flowchart of a semiconductor chip wet transfer method according to an embodiment. FIG. 16 is a diagram showing a suspension and a substrate according to an embodiment.

Referring to FIG. 14, a first liquid is supply to the recesses 110 of the transfer substrate 120 (S202).

After the first liquid is supplied to the recesses 110, the suspension including a second liquid and semiconductor chips 130 is supplied to the transfer substrate 120 (S203). The first liquid previously supplied to the transfer substrate 120 and the second liquid of the suspension may be of the same type or different types. After the semiconductor chips 130 are supplied to the transfer substrate 120, the align bar 140 absorbing a liquid performs sweeping across the transfer substrate 120 (S204).

Referring to FIGS. 15 and 16, the supplying of the suspension 170 to the transfer substrate 120 shown in FIG. 2 (S102) may be performed. To simultaneously supply the liquid L1 and the semiconductor chips 130 to the transfer substrate 120, the suspension 170 including the semiconductor chips 130 and the liquid L1 may be used. Through supplying of the suspension 170 to the transfer substrate 120 (S302), the liquid L1 may be supplied to the recesses 110 of the transfer substrate 120 and the semiconductor chips 130 may be supplied to the transfer substrate 120, and thus there is no need to supply a liquid to the recesses 110 in advance.

Figure 17:
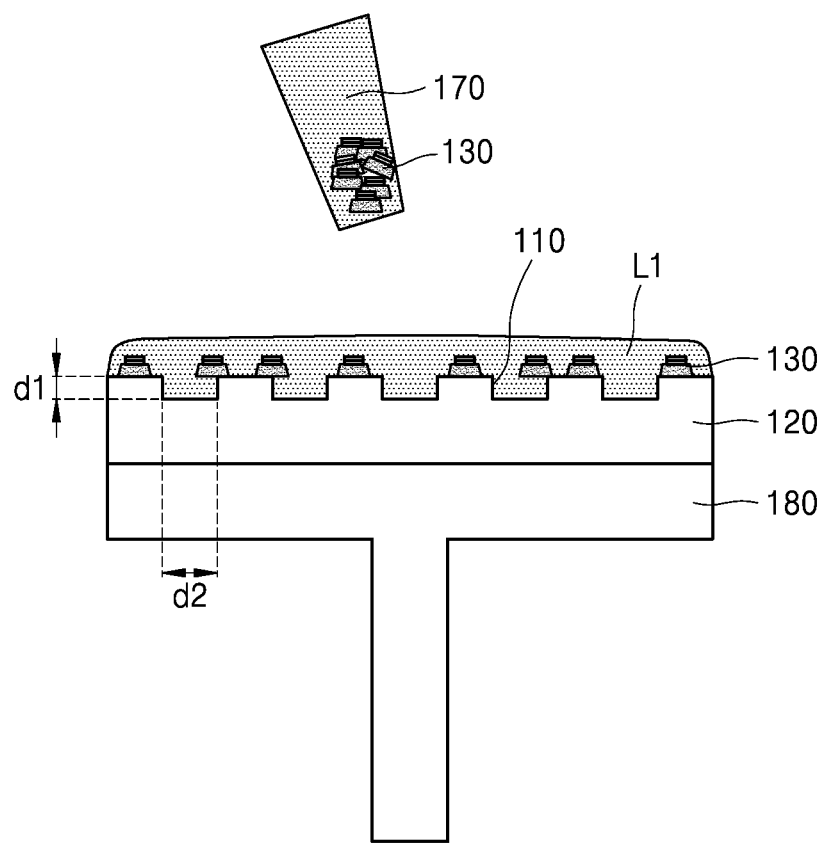
FIG. 17 is a diagram showing a state in which a suspension is supplied to a substrate, according to an embodiment.

FIG. 17 is a diagram showing a state in which a suspension is supplied to a substrate, according to an embodiment.

Referring to FIG. 17, a suspension described in the operations shown in FIG. 14 or 15 is provided. The transfer substrate 120 including the plurality of recesses 110 may be prepared on the transfer head 180. A depth d1 of the recess 110 may be about 20% smaller than the height of the semiconductor chips 130. A width d2 of the recess 110 may be about 25% larger than the width of the semiconductor chips 130. Then, the suspension 170 including the plurality of semiconductor chips 130 and the liquid L1 may be supplied to the transfer substrate 120.

Figure 18:
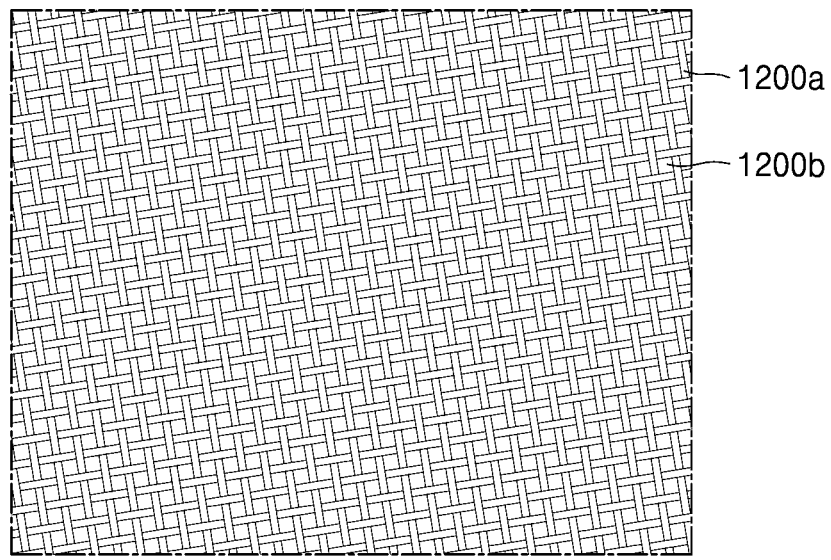
FIG. 18 shows an example of an align bar of semiconductor chip wet transfer equipment, according to an embodiment.

FIG. 18 shows an example of an align bar of semiconductor chip wet transfer equipment, according to an embodiment.

Referring to FIG. 18, a fabric 1200a may have a gap 1200b smaller than a semiconductor chip to prevent the semiconductor chip from being caught or stuck.

Figure 19:
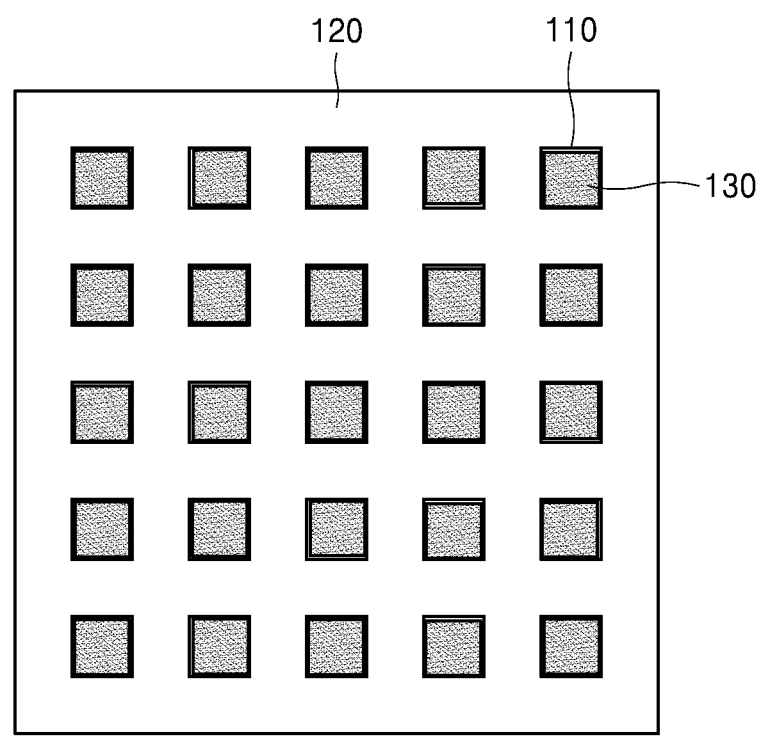
FIG. 19 is a plan view of a display transfer structure according to an embodiment.

FIG. 19 is a plan view of a display transfer structure according to an embodiment.

The semiconductor chips 130 transferred using the aforementioned wet transfer method may be irregularly and randomly positioned in the recesses 110 of the transfer substrate 120. Semiconductor chips aligned using the traditional stamping method are regularly positioned in the recesses of the transfer substrate, and in contrast, the aligned semiconductor chips 130 may be positioned irregularly in the recesses 110 of the transfer substrate 120. After transfer of the semiconductor chips is completed and the dummy semiconductor chips that are not positioned in the recesses 110 are removed, irregularity of the irregularly positioned semiconductor chips may be reduced by sweeping the transfer substrate one or more times with a clean align bar.

FIGS. 20 to 24 are diagrams showing a state in which semiconductor chips that are not aligned in recesses are removed, according to an embodiment.

With reference to FIGS. 20 to 24, an embodiment of removing dummy semiconductor chips remaining on a transfer substrate will be described.

Figure 20:
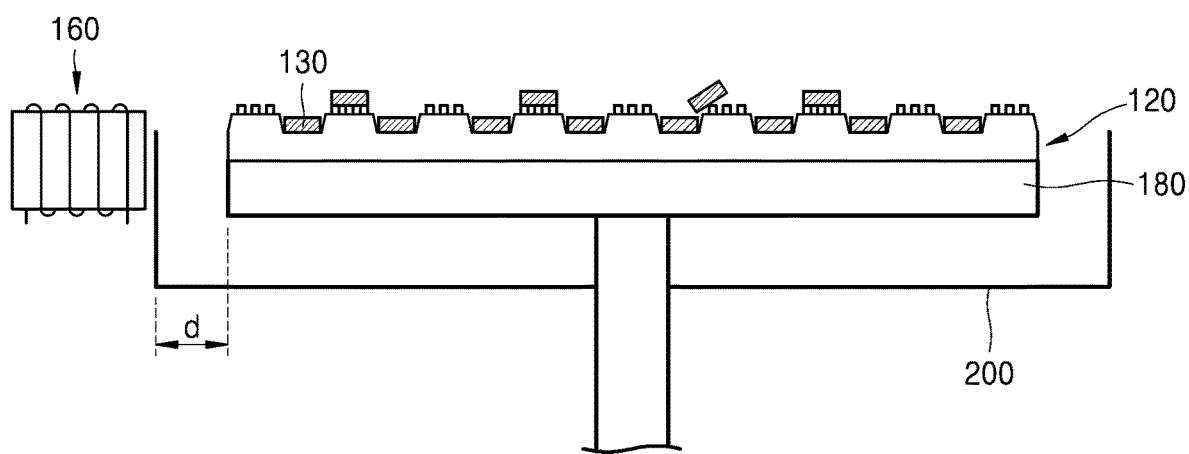
FIGS. 20 to 24 are diagrams showing a state in which semiconductor chips that are not aligned in recesses are removed, according to an embodiment.

Referring to FIG. 2, the removing of the dummy semiconductor chips remaining on the transfer substrate (S104) may be performed. Referring to FIG. 20, to perform the removing S104, the semiconductor chip wet transfer equipment 100 may further include a second magnetic force generating device 160 and a chamber 200 that accommodates the semiconductor chips 130 removed from the transfer substrate 120. The second magnetic force generating device 160 may be located outside the transfer substrate 120. For example, the second magnetic force generating device 160 may be disposed parallel to a side surface of the transfer substrate 120 among outer portions of the transfer substrate 120. Alternatively, the second magnetic force generating device 160 may be disposed to surround at least a portion of the transfer substrate 120.

The second magnetic force generating device 160 may include a magnetic material that generates a magnetic field regardless of an applied electric signal. Alternatively, the second magnetic force generating device 160 may include an electromagnet, and/or a ferromagnetic substance, which generates a magnetic field according to the applied electric signal.

A surface of the second magnetic force generating device 160, from which a magnetic field is generated, may be larger than a size of the recess 110 of the transfer substrate 120 or the semiconductor chip 130. As the surface of the second magnetic force generating device 160, from which a magnetic field is generated, is larger, a larger amount of the semiconductor chips 130 may be removed at one time.

The second magnetic force generating device 160 may provide a magnetic field that moves the semiconductor chips 130 positioned in an area other than the recesses 110 of the transfer substrate 120 without moving the semiconductor chips 130 positioned in the recesses 110 of the transfer substrate 120, to the transfer substrate 120. The semiconductor chips 130 positioned in an area other than the recesses 110 may be removed from the transfer substrate 120 by the magnetic field described above. For example, the semiconductor chips 130 may be removed from the transfer substrate 120 by movement in a direction parallel to the upper surface of the transfer substrate 120. The second magnetic force generating device 160 may move the semiconductor chips 130 to a space located on the side surface of the transfer substrate 120.

Figure 21:
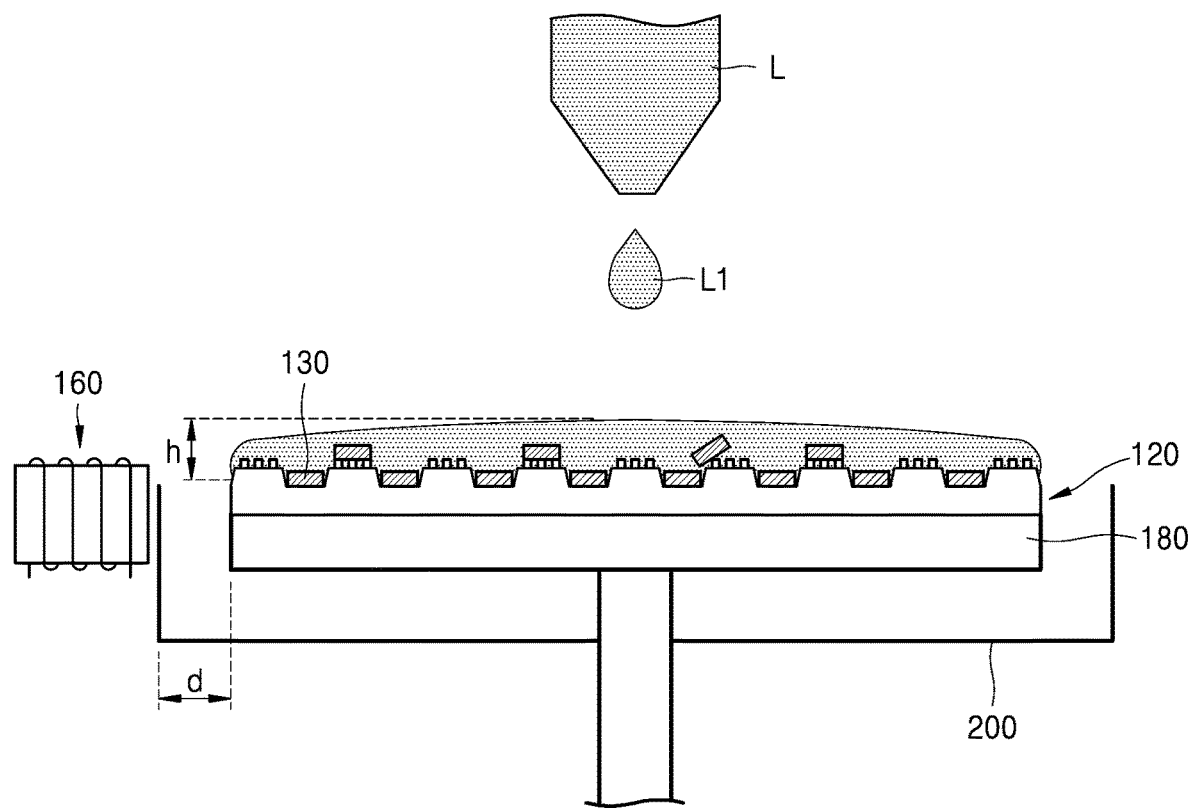

Referring to FIG. 21, to increase fluidity of the semiconductor chips 130, the semiconductor chip wet transfer equipment 100 may further include a liquid supply module L supplying the liquid L1 onto the transfer substrate 120.

Any type of liquid may be used as the liquid L1 as long as the liquid does not corrode or damage the semiconductor chips 130.

The liquid supply module L may supply the liquid L1 to the transfer substrate 120. The liquid L1 may cover the semiconductor chips 130 positioned in the recesses 110 of the transfer substrate 120 and the semiconductor chips 130 positioned on the upper surface other than the recesses 110 of the transfer substrate 120. A height h to an upper surface of the liquid L1 from the upper surface of the transfer substrate 120 may be greater than the size of the semiconductor chip 130. Thus, even when the semiconductor chips 130 move within the liquid L1, friction between a surface of the transfer substrate 120 and other semiconductor chips 130 may be reduced.

Figure 22:
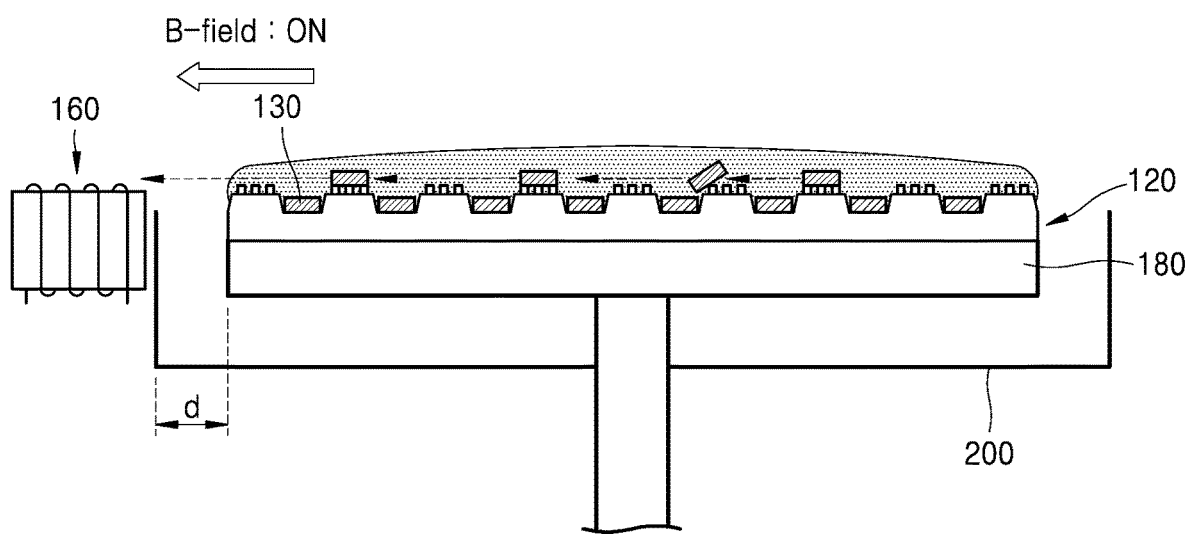

FIG. 22 is a reference diagram showing a state in which a magnetic field is provided to the transfer substrate 120, according to an embodiment. Referring to FIG. 22, the second magnetic force generating device 160 may provide a magnetic field for moving the semiconductor chips 130 positioned in an area other than the recesses 110 of the transfer substrate 120, to the transfer substrate 120. The second magnetic force generating device 160 may provide a magnetic field in a direction parallel to an upper surface S of the transfer substrate 120. The strength of the magnetic field may be determined according to the characteristics of a magnetic material included in the second magnetic force generating device 160, a distance between the second magnetic force generating device 160 and the transfer substrate 120, an electric signal applied to the second magnetic force generating device 160. For example, when the second magnetic force generating device 160 includes an electromagnet, the strength of the magnetic field may be adjusted by the strength of the electric signal applied to the second magnetic force generating device 160.

The semiconductor chip 130 may have the magnetic layer 131 including a magnetic material, and thus may move due to an attractive force caused by the magnetic field provided by the second magnetic force generating device 160. Alternatively, the semiconductor chip 130 may further include other magnetic materials. Thus, the semiconductor chips 130 may move to an area in which the magnetic field is strong due to an attractive force caused by the magnetic field. For example, the semiconductor chips 130 may move toward the second magnetic force generating device 160. In contrast, the semiconductor chips 130 already transferred to the recesses 110 also attempt to move toward the second magnetic force generating device 160, but may be blocked by the recess 110 and may not move, and thus, only semiconductor chips 130 that are not transferred to the recesses 110 may move toward the second magnetic force generating device 160.

Figure 23:
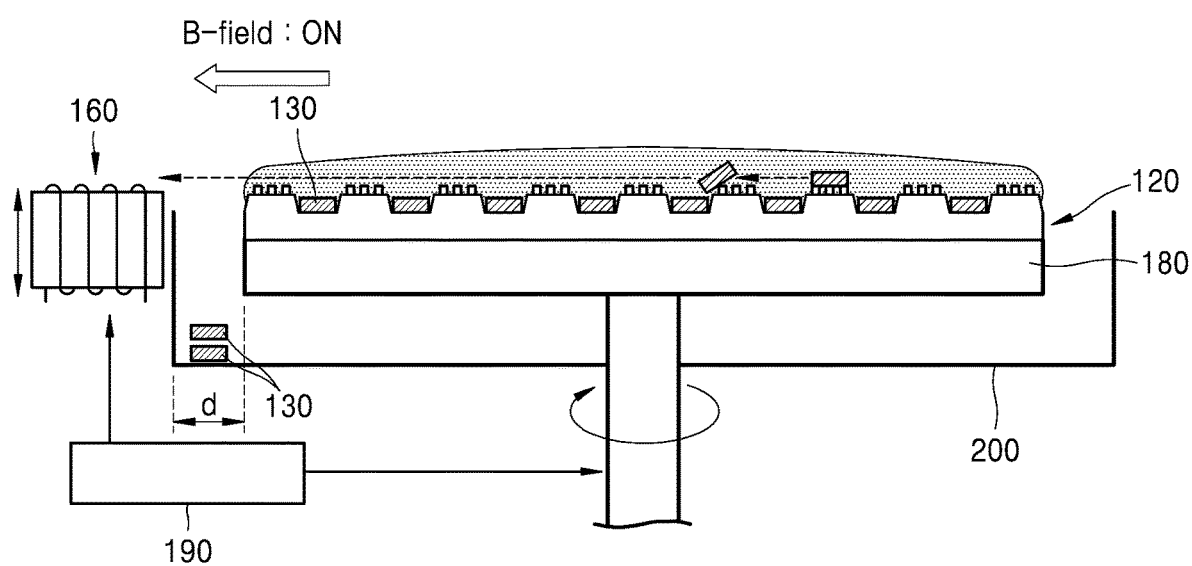

Referring to FIG. 23, the semiconductor chip wet transfer equipment may further include an actuator 190 that controls movement of the second magnetic force generating device 160 or the transfer head 180, and the actuator 190 may be controlled by the controller 1200 shown in FIG. 1 by receiving an electric signal. For example, the second magnetic force generating device 160 may change a state of the magnetic field through vibration, and the semiconductor chips 130 that are not transferred to the recesses 110 may easily move due to the change in the state of the magnetic field. Alternatively, the actuator 190 may control the transfer head 180 such that the transfer substrate 120 performs at least one of a rotational motion, a vibration motion, a tilt motion, a vertical motion, and a horizontal motion.

The semiconductor chips 130 may move close to the second magnetic force generating device 160 in a direction parallel to the upper surface S of the transfer substrate 120.

The transfer substrate 120 is spatially spaced apart from a side surface of the chamber 200. A distance d between the transfer substrate 120 and the side surface of the chamber 200 may be greater than the size of the semiconductor chip 130. When the semiconductor chips 130 that are not transferred to the recess 110 move to a space between the transfer substrate 120 and the side surface of the chamber 200, the second magnetic force generating device 160 may stop providing a magnetic field. For example, the second magnetic force generating device 160 may move away from the chamber 200, or application of the electric signal applied to the second magnetic force generating device 160 may be terminated. The semiconductor chips 130 located in the space between the transfer substrate 120 and the side surface of the chamber 200 may move to a bottom surface of the chamber 200 by gravity.

Figure 24:
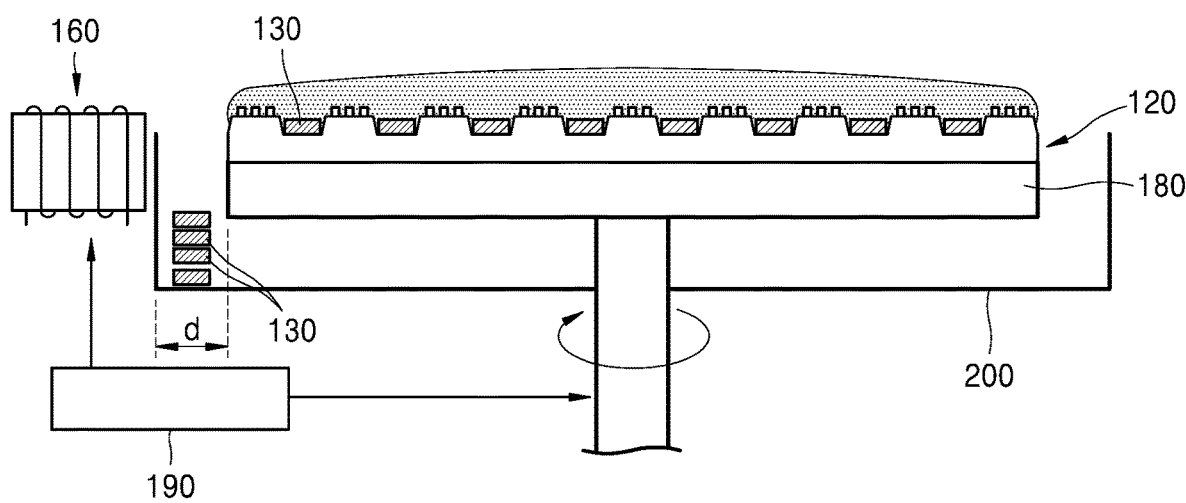

Referring to FIG. 24, the semiconductor chips 130 moved by the magnetic field are not attached to the side surface of the chamber 200, but are gathered in the space between the transfer substrate 120 and the side surface of the chamber 200. The semiconductor chips 130 gathered in the chamber 200 may be collected and reused.

The second magnetic force generating device 160 removes the semiconductor chips 130 from the transfer substrate 120 without direct contact with the semiconductor chips 130 and the transfer substrate 120, thereby preventing the semiconductor chips 130 and the transfer substrate 120 from being damaged. The semiconductor chips 130 that are not damaged may be collected and reused.

The second magnetic force generating device 160 provides a magnetic field in a direction parallel to the upper surface S of the transfer substrate 120, but is not limited thereto. The second magnetic force generating device 160 may provide a magnetic field in a direction perpendicular to the transfer substrate 120.

Figure 25:
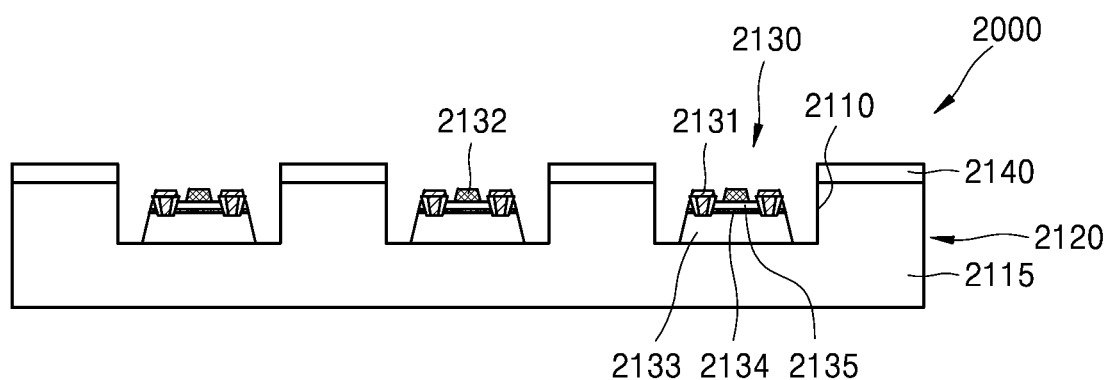
FIGS. 25 to 28 are cross-sectional views of a display transfer structure.

FIG. 25 is a schematic diagram of a display transfer structure 2000 according to an embodiment.

Referring to FIG. 25, the display transfer structure 2000 may include a transfer substrate 2120 including a plurality of recesses 2110 on a substrate 2115 and semiconductor chips 2130 positioned in the plurality of recesses 2110.

The semiconductor chip 2130 includes a first electrode 2131 and a second electrode 2132 on a surface facing an upper opening of the recess 2110, and may not include an electrode on a surface facing the bottom of each of the recess 2110. The semiconductor chips 2130 may include an n-type semiconductor layer 2133, an active layer 2134, and a p-type semiconductor layer 2135. The n-type semiconductor layer 2133 may be an n-type GaN layer, and the p-type semiconductor layer 2135 may be a p-type GaN layer. The active layer 2134 may have, for example, a quantum well structure or a multi-quantum well structure. The transfer substrate 2120 may further include a metal layer 2140 on an upper surface of the substrate 2115. The metal layer 2140 may include Ag, Au, Pt, Ni, Cr, and/or Al, and may well separate the dummy semiconductor chips from the transfer substrate 2120, as described above.

As shown in FIG. 25, the transfer substrate 2120 may be formed as a single body or may further include the metal layer 2140, but may be configured in various ways.

Figure 26:
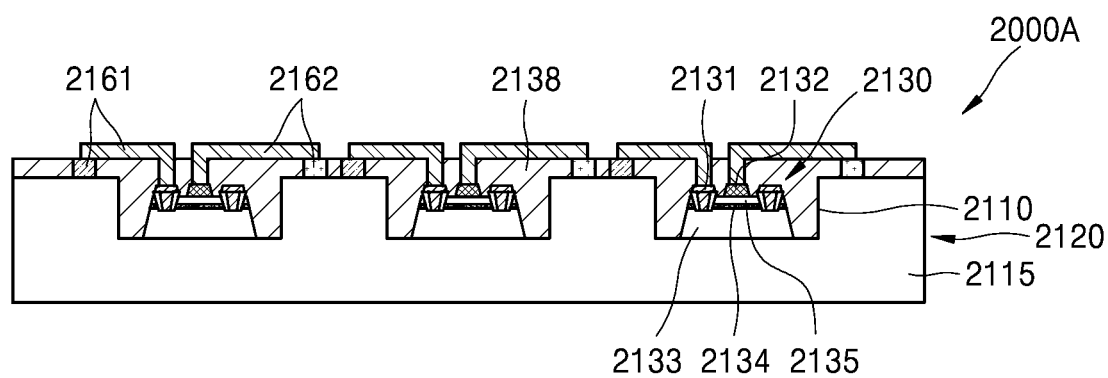

FIG. 26 shows an example in which the display transfer structure 2000 shown in FIG. 25 further includes another layer. A detailed description of the same components as those of the display transfer structure 2000 shown in FIG. 25 is omitted.

Referring to FIG. 26, a display transfer structure 2000A may include an insulating layer 2138 provided on the transfer substrate 2120, and driving circuits 2161 and 2162 provided on the insulating layer 2138 and connected to the first electrode 2131 and the second electrode 2132. Although FIG. 26 shows an example in which the driving circuits 2161 and 2162 are provided above the transfer substrate 2120, the driving circuits 2161 and 2162 may also be provided below the transfer substrate 2120. The three semiconductor chips 2130 included in the display transfer structure 2000A may respectively emit light of different colors. For example, the three semiconductor chips 2130 may emit red light (R), green light (G), and blue light (B), respectively, and the display transfer structure 2000A may be applied to an RGB self-emitting micro-LED TV.

Figure 27:
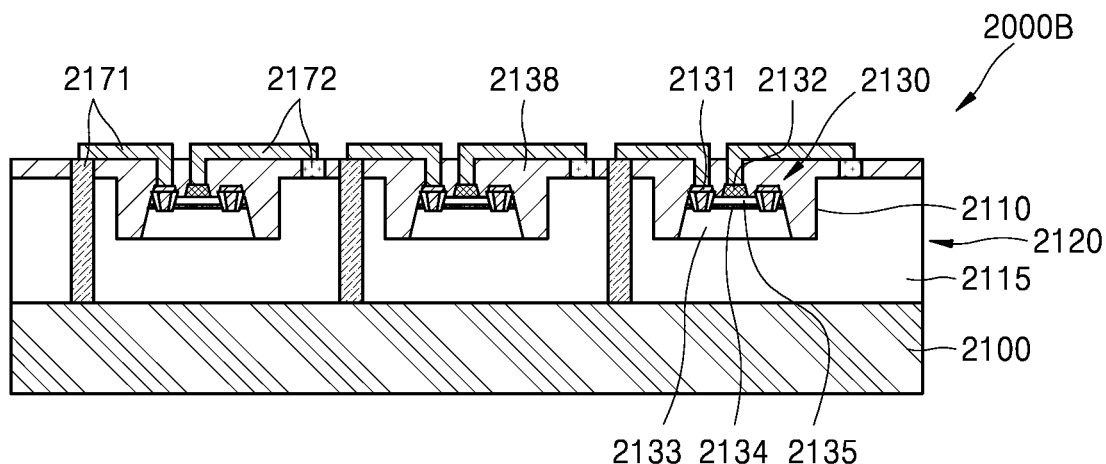

FIG. 27 shows an example in which a display transfer structure 2000B of FIG. 26 further includes a driving circuit board 2100.

Figure 28:
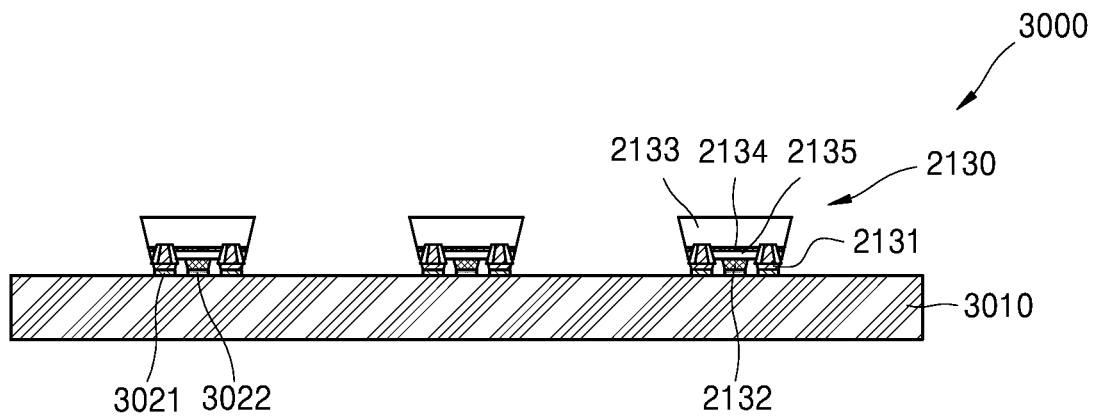

Components using the same reference numerals in FIG. 27 as those of FIG. 26 have substantially the same functions and configurations as those described in FIG. 28, and thus a detailed description thereof is omitted.

The display transfer structure 2000B may include the driving circuit board 2100 below the transfer substrate 2120. The driving circuit board 2100 may include a driving transistor, a switch transistor, and a capacitor. The display transfer structure 2000B may include driving circuits 2171 and 2172 connected to the first electrode 2131 and the second electrode 2132 on the insulating layer 2138, and the driving circuit 2171 may be connected to the driving circuit board 2100.

FIG. 28 is a cross-sectional view of a display transfer structure 3000 according to an embodiment.

The display transfer structure 3000 may include a driving circuit board 3010 including a transistor and a capacitor. The micro semiconductor chips 2130 aligned on the transfer substrate 2120 shown in FIG. 27 may be transferred and bonded to the driving circuit board 3010. The driving circuit board 3010 may include a first circuit 3021 and a second circuit 3022, and when the micro semiconductor chips 2130 are transferred, the first electrode 2131 may be connected to the first circuit 3021, and the second electrode 2132 may be connected to the second circuit 3022.

Figure 29:
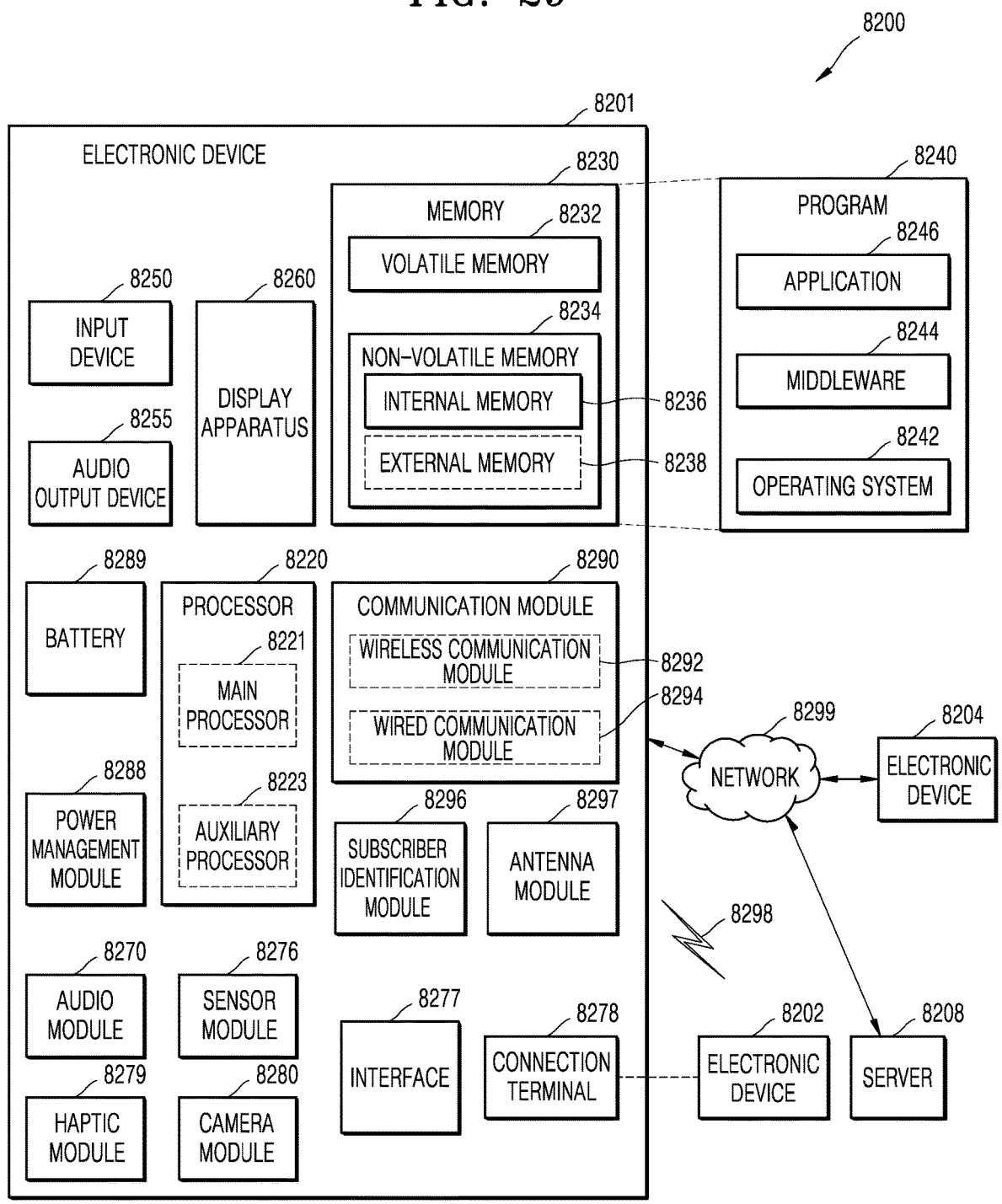
FIG. 29 is a schematic block diagram of an electronic device according to an embodiment.

FIG. 29 is a schematic block diagram of an electronic device 8201 according to an embodiment.

Referring to FIG. 29, the electronic device 8201 may be provided in a network environment 8200. In the network environment 8200, the electronic device 8201 may communicate with another electronic device 8202 through a first network 8298 (such as a local area wireless communication network) or communicate with another electronic device 8204 and/or a server 8208 through a second network 8299 (such as a long-distance wireless communication network). The electronic device 8201 may communicate with the electronic device 8204 through the server 8208. The electronic device 8201 may include a processor 8220, a memory 8230, an input device 8250, a sound output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as a single integrated circuit. For example, the sensor module 8276 (e.g., a fingerprint sensor, an iris sensor, and/or an illuminance sensor) may be embedded and implemented in the display device 8260 (display).

The processor 8220 may execute software (e.g., a program 8240) to control one or a plurality of other components (e.g., hardware, and/or software components) of the electronic device 8201 connected to the processor 8220, and perform processing or computation on various data. As a part of data processing or computation, the processor 8220 may load a command and/or data received from other components (e.g., the sensor module 8276, and/or the communication module 8290) to a volatile memory 8232, process the command and/or data stored in the volatile memory 8232, and store the resulting data in a non-volatile memory 8234. The processor 8220 may include a main processor 8221 (e.g., a central processing device, and/or an application processor) and an auxiliary processor 8223 that operates independently or together therewith (e.g., a graphics processing device, an image signal processor, a sensor hub processor, and/or a communication processor). The auxiliary processor 8223 may use less power than the main processor 8221 and perform a specialized function.

The auxiliary processor 8223 may control a function and/or a state related to some components of the electronic device 8201 (e.g., the display device 8260, the sensor module 8276, the communication module 8290) on behalf of the main processor 8221 while the main processor 8221 is inactive (in a sleep state), or together with the main processor 8221 while the main processor 8221 is active (in an application execution state). The auxiliary processor 8223 (e.g., an image signal processor, and/or a communication processor) may also be implemented as some of other components that are functionally related thereto (e.g., the camera module 8280, and/or the communication module 8290).

The memory 8230 may store various data required by components of the electronic device 8201 (e.g., the processor 8220, and/or a sensor module 8276). The data may include, for example, software (such as the program 8240) and input data and/or output data for commands related thereto. The memory 8230 may include the volatile memory 8232 and/or the non-volatile memory 8234. The non-volatile memory 8234 may include an internal memory 8236 and an external memory 8238.

The program 8240 may be stored as software in the memory 8230, and may include an operating system 8242, middleware 8244, and/or an application 8246.

The input device 8250 may receive a command and/or data to be used in a component of the electronic device 8201 (such as the processor 8220) from the outside of the electronic device 8201 (such as a user). The input device 8250 may include a remote controller, a microphone, a mouse, a keyboard, and/or a digital pen (such as a stylus pen).

The sound output device 8255 may output a sound signal to the outside of the electronic device 8201. The sound output device 8255 may include a speaker and/or a receiver. The speaker may be used for general purposes, such as multimedia playback or recording playback, and the receiver may be used to receive an incoming call. The receiver may be integrated as a part of the speaker or implemented as an independent separate device.

The display device 8260 may visually provide information to the outside of the electronic device 8201. The display device 8260 may include a display, a hologram device, or a control circuit for controlling a projector and a corresponding device. The display device 8260 may include a touch circuitry configured to sense a touch and/or a sensor circuit (such as a pressure sensor) configured to measure the strength of a force generated by the touch.

The audio module 8270 may convert sound into an electrical signal or conversely convert an electrical signal into sound. The audio module 8270 may acquire sound through the input device 8250 or output sound through a headphone and/or a speaker of other electronic devices (e.g., the electronic device 8202) that are directly or wirelessly connected to the sound output device 8255, and/or the electronic device 8201.

The sensor module 8276 may detect an operating state (e.g., power, and/or temperature) of the electronic device 8201 or an external environmental state (e.g., a user state) and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biosensor, a temperature sensor, a humidity sensor, and/or an ambient light sensor.

The interface 8277 may support one or more specified protocols to be used to directly or wirelessly connect the electronic device 8201 to another electronic device (such as the electronic device 8202). The interface 8277 may include a high definition multimedia interface (HDMI), a universal serial bus (USB) interface, a secure digital (SD) card interface, and/or an audio interface.

A connection terminal 8278 may include a connector through which the electronic device 8201 is physically connected to another electronic device (such as the electronic device 8202). The connection terminal 8278 may include a HDMI connector, a USB connector, a SD card connector, and/or an audio connector (e.g., headphone connector).

The haptic module 8279 may convert an electric signal into a mechanical stimulation (e.g., vibration, and/or movement) or an electrical stimulation that a user is capable of perceiving through tactile or kinesthetic senses. The haptic module 8279 may include a motor, a piezoelectric element, and/or an electrical stimulation device.

The camera module 8280 may capture a still image and a moving image. The camera module 8280 may include a lens assembly including one or more lenses, image sensors, image signal processors, and/or flashes. The lens assembly included in the camera module 8280 may collect light emitted from a subject that is an image capture target.

The power management module 8288 may manage power supplied to the electronic device 8201. The power management module 8288 may be implemented as a part of a power management integrated circuit (PMIC).

The battery 8289 may supply power to the components of the electronic device 8201. The battery 8289 may include a non-rechargeable primary battery, a rechargeable secondary battery, and/or a fuel cell.

The communication module 8290 may establish a direct (wired) communication channel and/or a wireless communication channel between the electronic device 8201 and other electronic devices (e.g., the electronic device 8202, the electronic device 8204, and/or the server 8208), and support communication through the established communication channel. The communication module 8290 may include one or more communication processors that operate independently of the processor 8220 (e.g., an application processor) and support direct communication and/or wireless communication. The communication module 8290 may include a wireless communication module 8292 (a cellular communication module, a local area wireless communication module, or a global navigation satellite system (GNSS) communication module) and/or a wired communication module 8294 (e.g., a local area network (LAN) communication module, and/or a power line communication module). Among these communication modules, a corresponding communication module may communicate with other electronic devices through the first network 8298 (a local area communication network such as Bluetooth, WiFi direct or infrared data association (IrDA)) or the second network 8299 (a long-distance communication network such as a cellular network, the Internet, or computer network (LAN or WAN)). These various types of communication modules may be integrated into one component (e.g., a single chip) or implemented as a plurality of separate components (multiple chips). The wireless communication module 8292 may check and authenticate the electronic device 8201 within a communication network such as the first network 8298 and/or the second network 8299 using subscriber information (e.g., an international mobile subscriber identifier (IMSI)) stored in the subscriber identification module 8296.

The antenna module 8297 may transmit a signal and/or power to the outside (e.g., other electronic devices) or receive the same from the outside. An antenna may include a radiator made of a conductive pattern formed on a substrate (e.g., a PCB). The antenna module 8297 may include one or a plurality of antennas. When a plurality of antennas are provided, an antenna suitable for a communication method used in a communication network such as the first network 8298 and/or the second network 8299 may be selected from among the plurality of antennas by the communication module 8290. A signal and/or power may be transmitted or received between the communication module 8290 and other electronic devices through the selected antenna. In addition to the antenna, other components (e.g., RFIC) may be included as a part of the antenna module 8297.

Some of components may be connected to each other through a communication method between peripheral devices (e.g., a bus, general purpose input and output (GPIO), a serial peripheral interface (SPI), and/or a mobile industry processor interface (MIP)) to exchange signals (e.g., a command, and/or data) with each other.

The command or the data may be transmitted or received between the electronic device 8201 and the external electronic device 8204 through the server 8208 connected to the second network 8299. The other electronic devices 8202 and 8204 may be the same as or different from the electronic device 8201. All or some of the operations executed in the electronic device 8201 may be executed in one or more of the other electronic devices 8202, 8204, and 8208. For example, when the electronic device 8201 needs to perform functions or services, the electronic device 8201 may request one or more other electronic devices to perform all or some of the functions or services instead of executing the functions or services themselves. One or more other electronic devices receiving the request may execute an additional function or service related to the request and deliver the result of the execution to the electronic device 8201. To this end, cloud computing, distributed computing, and/or client-server computing technologies may be used.

Figure 30:
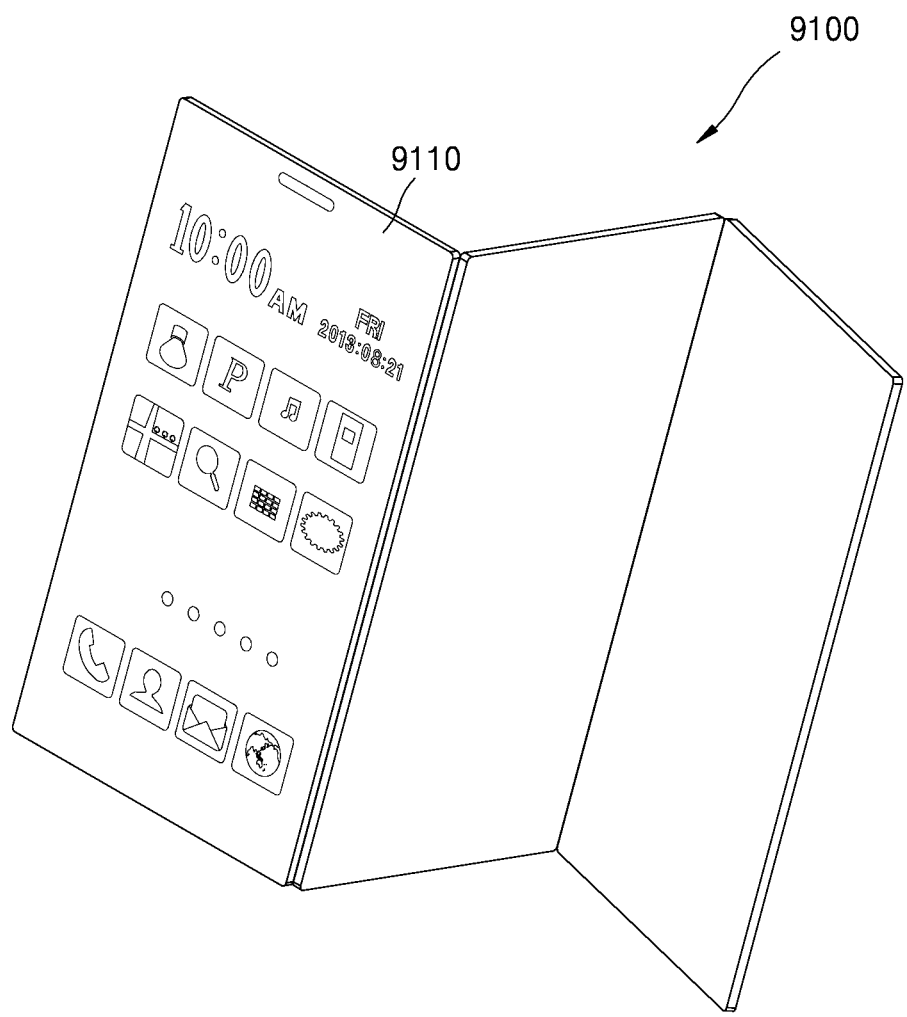
FIG. 30 shows an example in which a display device is applied to a mobile device according to an embodiment.

FIG. 30 shows an example in which a display device 9110 is applied to a mobile device 9100 according to an embodiment.

Referring to FIG. 30, the mobile device 9100 may include the display device 9110, and the display device 9110 may include the display transfer structure described with reference to FIGS. 25 to 28. The display device 9110 may have a foldable structure, for example, a multi-foldable structure.

Figure 31:
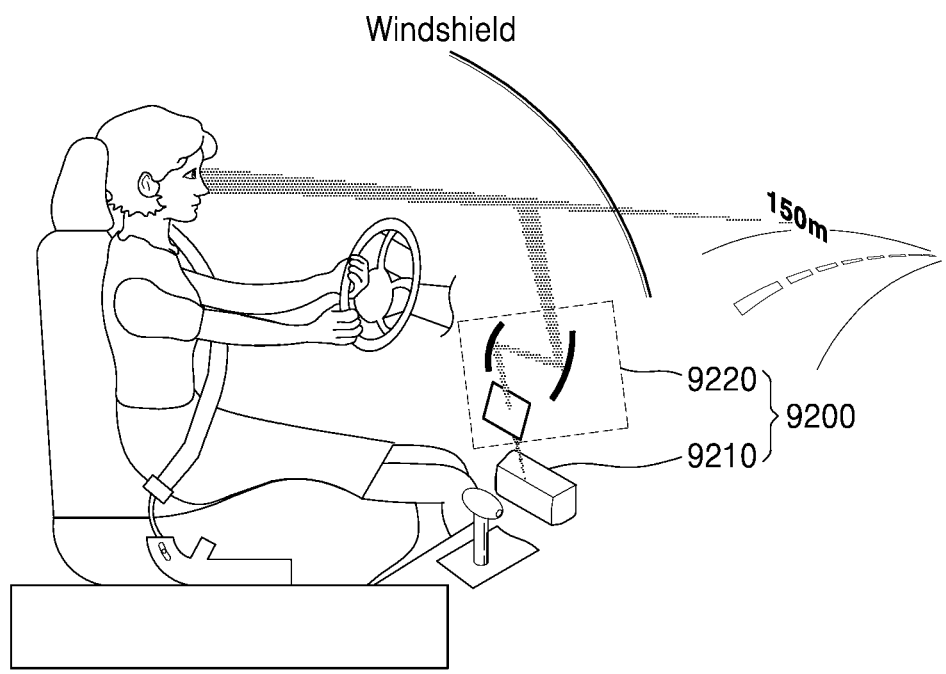
FIG. 31 shows an example in which a display device is applied to a vehicular display device, according to an embodiment.

FIG. 31 shows an example in which a display device is applied to a vehicular display device, according to an embodiment.

Referring to FIG. 31, the display device may be a head-up display device 9200 for a vehicle, and may include a display 9210 provided at one area of the vehicle, and an optical path change member 9220 that converts an optical path to allow a driver to view an image generated by the display 9210.

Figure 32:
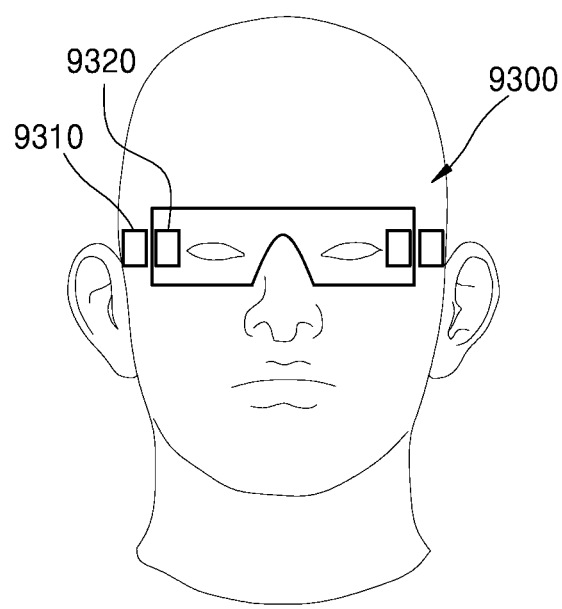
FIG. 32 shows an example in which a display device is applied to augmented reality glasses, according to an embodiment.

FIG. 32 shows an example in which a display device is applied to augmented reality glasses 9300, according to an embodiment.

Referring to FIG. 32, the augmented reality glasses 9300 may include a projection system 9310 forming an image, and an element 9320 that guides the image from the projection system 9310 into the eyes of a user. The projection system 9310 may include a display transfer structure.

Figure 33:
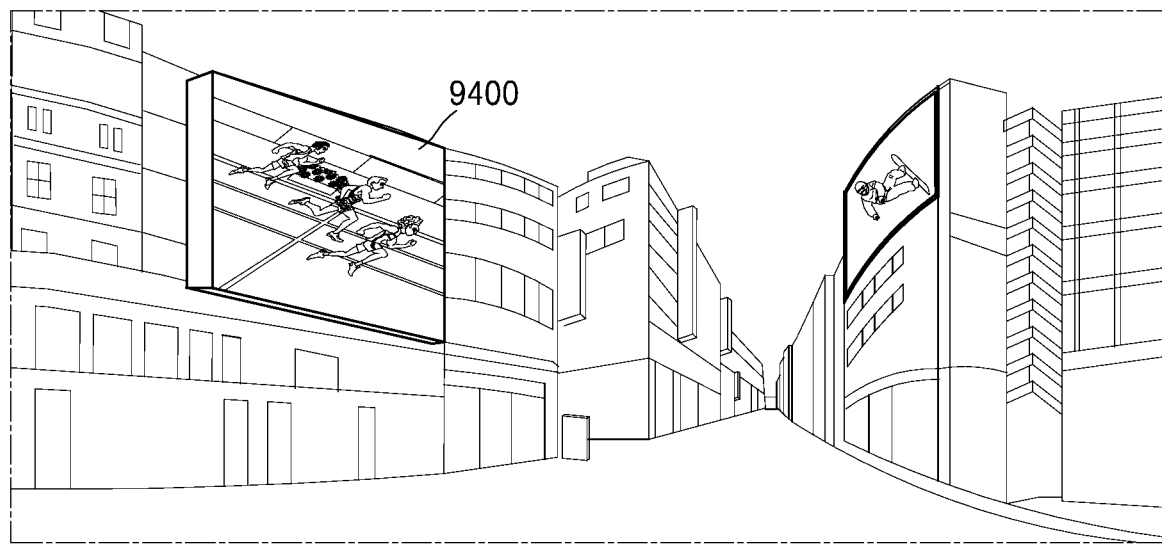
FIG. 33 shows an example in which a display device is applied to a signage, according to an embodiment.

FIG. 33 shows an example in which a display device is applied to a signage 9400, according to an embodiment.

Referring to FIG. 33, the signage 9400 may be used for outdoor advertisement using a digital information display, and may control advertisement content through a communication network. The signage 9400 may be implemented through, for example, the electronic device described with reference to FIG. 29.

Figure 34:
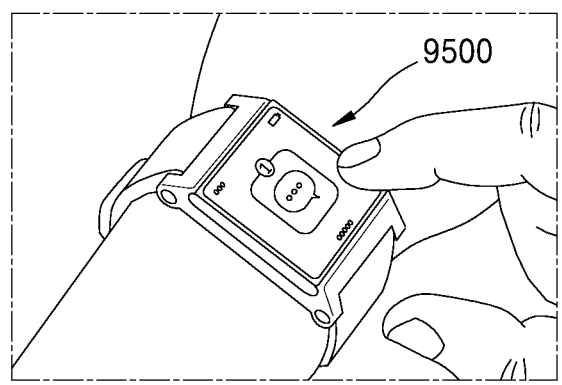
FIG. 34 shows an example in which a display device is applied to a wearable device, according to an embodiment.

FIG. 34 shows an example in which a display device is applied to a wearable device 9500, according to an embodiment.

Referring to FIG. 34, the wearable display 9500 may include the display transfer structure described with reference to FIGS. 19, 25 to 28, and may be implemented through the electronic device described with reference to FIG. 29.

The display device may be applied to various products such as a rollable television (TV) or a stretchable display.

In the transfer method, semiconductor chips may be efficiently aligned in a large area by a wet method, and a process of fixing the semiconductor chips through a magnetic force generating device and a cleaning process on semiconductor chips that are not transferred may be performed.

In the transfer equipment, semiconductor chips may be aligned on a large area and may be easily adopted in a large display device, and a transfer time may be reduced and a yield may be increased through the magnetic force generating device.

The above embodiments are only exemplary, and those skilled in the art will understand that various modifications and equivalent other embodiments are possible therefrom. Therefore, the true technical scope is to be determined by the technical spirit of the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor chip wet transfer method comprising:
preparing a transfer substrate that includes a plurality of recesses;
supplying a liquid that includes semiconductor chips onto the plurality of recesses of the transfer substrate;
aligning the semiconductor chips in the plurality of recesses by sweeping, with an align bar, an upper surface of the transfer substrate supplied with the liquid; and
performing cleaning by removing semiconductor chips that are not aligned in the plurality of recesses by using a first magnetic force generating device disposed facing a lower surface of the transfer substrate.

2. The semiconductor chip wet transfer method of claim 1, wherein the cleaning comprises (i) simultaneously moving the first magnetic force generating device with the align bar to a corresponding position, and (ii) applying a magnetic force to an area corresponding to an area of the upper surface of the transfer substrate, which is swept with the align bar.

3. The semiconductor chip wet transfer method of claim 2, wherein, in the first magnetic force generating device, magnetism is provided or a magnetic pole or a magnetic force is adjusted according to an electric signal.

4. The semiconductor chip wet transfer method of claim 1, wherein the first magnetic force generating device has an area greater than or equal to an entire area of the transfer substrate.

5. The semiconductor chip wet transfer method of claim 4,
wherein, in the first magnetic force generating device, magnetism is provided or a magnetic pole or a magnetic force is adjusted according to an electric signal, and
wherein the cleaning comprises inputting the electric signal to an area corresponding to the align bar to apply the magnetic force.

6. The semiconductor chip wet transfer method of claim 4,
wherein the first magnetic force generating device includes a driver located at one side of the first magnetic force generating device, and
wherein when the align bar sweeps an upper portion of the transfer substrate, the driver moves up and down to apply a magnetic force.

7. The semiconductor chip wet transfer method of claim 1, further comprising removing, by a second magnetic force generating device, the semiconductor chips that are not aligned in the plurality of recesses from the transfer substrate by moving the semiconductor chips that are not aligned in the plurality of recesses in a first direction using a magnetic field.

8. The semiconductor chip wet transfer method of claim 7, wherein the removing by the second magnetic force generating device includes providing, by the second magnetic force generating device, the magnetic field to move the semiconductor chips that are not aligned in the plurality of recesses in a second direction perpendicular to the first direction.

9. Semiconductor chip wet transfer equipment comprising:
a transfer head configured to support a transfer substrate on which semiconductor chips are aligned;
an align bar configured to sweep the transfer substrate on the transfer head; and
a first magnetic force generating device disposed on a lower surface of the transfer head,
wherein the first magnetic force generating device is configured to apply a magnetic force toward a bottom of each of a plurality of recesses formed in the transfer substrate.

10. The semiconductor chip wet transfer equipment of claim 9,
wherein the transfer head comprises a rail portion, and
wherein the first magnetic force generating device is configured to perform a translating motion along the rail portion.

11. The semiconductor chip wet transfer equipment of claim 9, wherein the first magnetic force generating device is configured to (i) simultaneously move with the align bar to a corresponding area, and (ii) apply a magnetic force to an area of the upper surface of the transfer substrate, which is swept with the align bar.

12. The semiconductor chip wet transfer equipment of claim 11, wherein the first magnetic force generating device is configured to provide magnetism or adjust a magnetic pole or a magnetic force according to an electric signal.

13. The semiconductor chip wet transfer equipment of claim 11, wherein, based on a direction in which the align bar or the first magnetic force generating device moves, a width of the first magnetic force generating device is smaller than a width of the transfer substrate.

14. The semiconductor chip wet transfer equipment of claim 9, wherein the first magnetic force generating device has an area greater than or equal to an entire area of the transfer substrate.

15. The semiconductor chip wet transfer equipment of claim 14,
wherein the first magnetic force generating device is configured to provide magnetism or adjust a magnetic pole or the magnetic force according to an electric signal, and
wherein the electric signal is input to an area in which transfer is performed with the align bar to apply the magnetic force.

16. The semiconductor chip wet transfer equipment of claim 14, wherein the first magnetic force generating device comprises a driver that is disposed on a lower surface of the first magnetic force generating device and is configured to vertically move up and down.

17. The semiconductor chip wet transfer equipment of claim 9, wherein a semiconductor chip of the semiconductor chips is included in each of the plurality of recesses of the transfer substrate,
wherein the semiconductor chip comprises an electrode,
wherein the electrode comprises a magnetic layer,
wherein the magnetic layer comprises a magnetic material, and
wherein the magnetic material comprises at least one metal of nickel (Ni), iron (Fe), cobalt (Co), gadolinium (Gd), or an alloy thereof.

18. The semiconductor chip wet transfer equipment of claim 9, further comprising:
a liquid feeder configured to supply a liquid to a recess of the plurality of recesses; and
a semiconductor chip feeder configured to supply a semiconductor chip aligned in the recess.

19. The semiconductor chip wet transfer equipment of claim 9, further comprising:
- a chamber configured to accommodate the transfer head therein; and
- a second magnetic force generating device configured to remove semiconductor chips that are not aligned in the plurality of recesses from the transfer substrate by moving the semiconductor chips that are not aligned in the plurality of recesses in a direction parallel to an upper surface of the transfer substrate by using a magnetic field.

20. The semiconductor chip wet transfer equipment of claim 19, wherein the second magnetic force generating device is configured to move the semiconductor chips that are not aligned in the plurality of recesses to a space between the transfer substrate and a side surface of the chamber.

* * * * *